(12) United States Patent
Takatani

(10) Patent No.: US 11,201,233 B2
(45) Date of Patent: Dec. 14, 2021

(54) COMPOUND SEMICONDUCTOR HETEROJUNCTION BIPOLAR TRANSISTOR

(71) Applicant: Shinichiro Takatani, Tokyo (JP)

(72) Inventor: Shinichiro Takatani, Tokyo (JP)

(*) Notice: Subject to any disclaimer, the term of this patent is extended or adjusted under 35 U.S.C. 154(b) by 0 days.

(21) Appl. No.: 16/931,398

(22) Filed: Jul. 16, 2020

(65) Prior Publication Data
US 2021/0020764 A1 Jan. 21, 2021

(30) Foreign Application Priority Data
Jul. 19, 2019 (JP) .............................. JP2019-133841

(51) Int. Cl.
*H01L 29/737* (2006.01)
*H01L 29/10* (2006.01)
*H01L 29/08* (2006.01)
*H01L 29/205* (2006.01)

(52) U.S. Cl.
CPC ...... *H01L 29/7371* (2013.01); *H01L 29/0817* (2013.01); *H01L 29/1004* (2013.01); *H01L 29/205* (2013.01)

(58) Field of Classification Search
CPC ............. H01L 29/7371; H01L 29/1004; H01L 29/0817; H01L 29/205; H01L 29/66318; H01L 29/42304; H01L 29/41708; H01L 29/0813; H01L 29/7378; H01L 29/737; H01L 29/0603; H01L 29/0684
See application file for complete search history.

(56) References Cited

U.S. PATENT DOCUMENTS

| | | | |
|---|---|---|---|
| 4,879,256 A * | 11/1989 | Bean ................... G11C 16/02 | 438/797 |
| 10,256,329 B2 | 4/2019 | Takatani et al. | |
| 2004/0065363 A1* | 4/2004 | Fetzer ............... H01L 21/02543 | 136/262 |
| 2008/0026545 A1* | 1/2008 | Cooke ............... H01L 21/02463 | 438/478 |
| 2010/0006143 A1* | 1/2010 | Welser ............... H01L 31/03046 | 136/255 |

(Continued)

FOREIGN PATENT DOCUMENTS

JP 6378398 8/2018

OTHER PUBLICATIONS

P. M. Enquist, et al., "Heterojunctmon bipolar transistor using pseudomorphic GainAs for the base", Applied Physics Letters, vol. 49, Issue 3, Jul. 21, 1986, pp. 179-180.

(Continued)

*Primary Examiner* — Syed I Gheyas
(74) *Attorney, Agent, or Firm* — JCIPRNET

(57) ABSTRACT

The invention provides a structure of an emitter layer and a base layer that reduces the influence of a conduction band energy barrier generated at an interface between the emitter layer and the base layer on power amplifier characteristics for a GaAs HBT using InGaAs grown by pseudomorphic growth in the base layer. In the first invention, InGaP having a CuPt-type ordering is used in the emitter layer. In the second invention, a p-type impurity concentration of an InGaAs base layer grown by pseudomorphic growth is less in an emitter layer side portion than in a collector layer side portion.

15 Claims, 28 Drawing Sheets

(56) References Cited

U.S. PATENT DOCUMENTS

2015/0255585 A1* 9/2015 Chin ................ H01L 29/0821
257/76
2016/0197232 A1* 7/2016 Bour ................ H01L 33/30
257/13

OTHER PUBLICATIONS

D. A. Ahmari, et al., "High-speed InGaP/GaAs HBT's with a Strained $In_xGa_{1-x}As$ Base", IEEE Electron Device Letters, vol. 17, No. 5, May 1996, pp. 226-228.

M. Zachau, et al., "Luminescence and Raman measurements of $In_yGa_{1-y}P$ (0.3<y<0.5) grown by gas-source molecular beam epitaxy", Applied Physics Letters, vol. 60, Issue 17, Apr. 27, 1992, pp. 2098-2100.

Q. Liu, et al., "Growth temperature dependent band alignment at the $Ga_{0.51}In_{0.49}P$ to GaAs heterointerfaces", Journal of Applied Physics, vol. 79, Issue. 1, Jan. 1, 1996, pp. 305-309.

N. El-Masry, et al., "Ordered-disordered ternary alloys by atomic layer epitaxy", Optical and Quantum Electronics, vol. 23, Jan. 23, 1991, pp. S909-S913.

* cited by examiner

COMPOUND SEMICONDUCTOR HETEROJUNCTION BIPOLAR TRANSISTOR

CROSS-REFERENCE TO RELATED APPLICATION

This application claims the priority benefit of Japanese Application Serial No. 2019-133841, filed on Jul. 19, 2019. The entirety of the above-mentioned patent applications is hereby incorporated by reference herein and made a part of this specification.

BACKGROUND

1. Technical Field

The invention relates to a compound semiconductor heterojunction bipolar transistor with an emitter layer, a base layer and a collector layer epitaxially grown over a GaAs substrate in sequence. The emitter layer, the base layer and the collector layer include semiconductor layers that are substantially free of relaxation of the lattice strain caused by a lattice mismatch to GaAs, and especially the base layer at least includes an InGaAs layer obtained by pseudomorphic growth.

2. Related Art

A heterojunction bipolar transistor (hereinafter referred to as HBT) is a bipolar transistor using an emitter formed by a semiconductor material with a band gap greater than that of a base to achieve a high current gain and a low base resistance simultaneously. The HBT whose essential part is formed by compound semiconductor layers epitaxially grown over a GaAs substrate and free of relaxation of strain caused by a lattice mismatch to GaAs is hereinafter referred to as GaAs HBT. Particularly, when the GaAs HBT is used as an non-type transistor, the conduction electron, which is the main carrier of a current flowing between the emitter and the collector, is high in mobility, so that the GaAs HBT can be used for high frequency applications. Therefore, the GaAs HBT is widely used as a radio frequency (RF) power amplifier for mobile communication or wireless fidelity (WiFi).

In a typical GaAs HBT, the material same as that of substrate, i.e. GaAs, is used as a main material for the base layer and the collector layer, and since the lattice constant is the same as that of the substrate, there is no strain relaxation caused by a lattice mismatch. However, in the GaAs HBT of the invention, InGaAs is used in the base layer (refer to Non-Patent Document 1, Non-Patent Document 2, and Patent Document 1). The lattice constant of InGaAs is greater than that of GaAs serving as the substrate, and the difference is approximately proportional to the In content, but to obtain good transistor characteristics, InGaAs is grown by pseudomorphic growth where the compressive strain is maintained without relaxation due to generation of dislocations. If the thickness of the InGaAs layer exceeds a critical film thickness, the strain is relaxed due to generation of the dislocations, and lattice defects are formed in the crystals. The lattice defect plays a role as a recombination center for the conduction electrons (minority carriers) moving in the base to recombine with holes, and in addition, the released energy during the recombination further multiplies the lattice defects. Compared with transistors that operate with majority carriers, such as field effect transistors, the bipolar transistor uses minority carriers such as conduction electrons in the base layer, and the formation of lattice defects caused by the strain relaxation needs to be suppressed more strictly. Therefore, the thickness of the InGaAs base layer is sufficiently reduced compared to the critical film thickness. For example, when the composition of the InGaAs base layer is described as $In_jGa_{1-j}As$, a thickness of the base layer is set to be about 40 nm or less when the In content j is 0.1, and the thickness of the base layer is set to be 60 nm or less when the In content j is 0.07.

As stated above, although there are difficulties in the device fabrication and restrictions to the structures in the GaAs HBT using a pseudomorphic InGaAs as the base layer, in addition to the generally known advantages such as high mobility of the conduction electrons, the following advantages are also obtained because the band gap of InGaAs is smaller than that of GaAs. In the operation of the bipolar transistor, the emitter is grounded, and a positive voltage is applied to the base to set an electron current from the emitter through the base to the collector to become a certain threshold value, and this threshold voltage between the base and the emitter is called turn-on Vbe. The turn-on Vbe tends to become smaller as the band gap of a semiconductor used for the base becomes smaller. In FIG. 36a and FIG. 36b, depth dependence of the conduction band energy and the valence band energy calculated by two-dimensional device simulation are shown for the GaAs HBT with the base consisting of a GaAs layer and an InGaAs layer, respectively. FIG. 36b shows the case in which the In content j when the composition of InGaAs is described as $In_jGa_{1-j}As$ is 0.1 for example. The horizontal axis is the depth in a base-collector direction, which is measured from an origin in the interior of the emitter layer. In the GaAs HBT using InGaAs for the base layer shown in FIG. 36b, a composition gradient layer (which is shown in the figure as "composition gradient InGaAs collector layer") with the In concentration continuously changing from GaAs to the In concentration of the InGaAs base layer is inserted between the GaAs collector layer and the InGaAs base layer. The In content k when the composition is described as $In_kGa_{1-k}As$ continuously changes from approximately 0 on the GaAs collector layer side to approximately 0.1 on the InGaAs base layer side. The purpose is to make the conduction band energy smoothly connected from the collector to the base. As a result, the height of an energy peak between the base and the collector in the conduction band shown in the figure is reduced, and the blocking of conduction electron injected from the base to the collector is reduced. The p-type impurity concentration of the base layer is $4\times10^{19}$ cm$^{-3}$ in both cases of the GaAs base (FIG. 36a) and the InGaAs base (FIG. 36b). As shown by the thick downward arrow in FIG. 36b, for the GaAs HBT using InGaAs for the base layer, due to the reduction of the band gap, the conduction band energy of the base layer is 88 meV less than the conduction band energy for the device using GaAs for the base layer. Thus, the turn-on Vbe is reduced. It is preferable to reduce the turn-on Vbe for application to a high-frequency power amplifier. The reason is explained below. FIG. 37 schematically shows the GaAs HBT current-voltage characteristics for a collector current (Ic) and a voltage between the collector and the emitter (Vce) for different base currents (Ib) (thin solid lines), and load curves (thick solid lines). The size of the transistor defined by the total emitter area is 360 square microns. The load curve refers to a trace of the voltage and current at an operating frequency applied to a load on the output side of the transistor during high-frequency operation, and is shown by a closed loop. The three curves in FIG. 37 are cases where a direct current (DC) bias voltage Vce0 applied to the collector is 1 V, 3 V, and 5 V, respectively. For these load curves, Ic is suppressed in a high Vce region, and on the other hand, Ic rises sharply in a low Vce region (which is shown as the "low Vce region" in FIG. 37) where Vce is about 0.5 V. Therefore, the overlap between the voltage amplitude and the current amplitude in an output signal becomes smaller. Thus, the power loss is suppressed and the power added efficiency (PAE) is improved. Such a load curve may be realized by setting the DC bias voltage Vbe0 low to make Ic at the quiescent state low, and further by short-circuiting an output second harmonic component. The load curve shown in FIG. 37 is for a case where the output is saturated and the PAE reaches the maximum. The enhancement of PAE at the saturated power is important for power amplifiers designed for the operation at a saturated output. Especially in an envelope tracking type power amplifier, Vce0 dynamically changes according to the change in a modulation signal amplitude. Vce0 is increased at a high output, and Vce0 is decreased at a low output. Therefore, the transistor is always operated in a saturated region where the PAE reaches its maximum. Therefore, the PAE can be increased not only at a high output power but also at a low output power. In order to improve the performance of the envelope tracking type power amplifier, it is necessary to obtain good characteristics at points on the load curve when the PAE is at its maximum. In particular, it is important to improve the characteristics of the transistor in the region indicated as "low Vce region" in the figure. Vce in the "low Vce region" is about 0.5 V. On the other hand, for the transistor to be turned on and for the collector current Ic to flow, the voltage Vbe between the base and the emitter becomes a positive voltage much higher than 0.5 V. For example, Vbe for Ic=0.01 A is usually 1.25 V or above. Therefore, the voltage (Vbc) applied to the pn junction between the base and the collector becomes a high forward voltage. Therefore, the capacitance Cbc between the base and the collector becomes very large, and this becomes the main reason for the decrease in the PAE and the power gain in a saturated output power region. However, when InGaAs is used in the base layer to reduce the turn-on Vbe, the Vbe required to obtain the same Ic becomes smaller, so the forward voltage between the base and the collector becomes smaller. As a result, the increase in Cbc is suppressed, and the characteristics deterioration of a power amplifier operated at a saturated output power can be suppressed.

Next, a prior art with respect to the emitter of a GaAs HBT is described. Generally, in an HBT, a semiconductor with a band gap larger than that of the base layer is used in the emitter layer. Therefore, the injection of holes in the base layer into the emitter layer is suppressed. Therefore, even if the hole concentration in the base layer is set to be high in order to reduce the sheet resistance of the base layer, the hole current flowing from the base layer to the emitter layer can be made low, and a ratio of the current in the collector to the current in the base, i.e. current gain, can be maintained high. AlGaAs and InGaP are known as semiconductor materials having a small lattice mismatch to GaAs and a large band gap, and InGaP, which is also excellent in surface chemical stability, has been widely used as an emitter layer of the GaAs HBT in recent years. The In content i when the composition is described as $In_iGa_{1-i}P$ is set to be 0.48 to 0.5, so the lattice constant substantially matches that of GaAs. The InGaP layer used in the GaAs HBT is usually grown by a metalorganic chemical vapor deposition (MOCVD) method, and the band gap (Eg) determined by the wavelength of light emitted by photoluminescence is about 1.89 eV at room temperature (Non-Patent Document 3). The Eg (1.89 eV) of the InGaP layer used in the GaAs HBT is sufficiently large compared with Eg of GaAs which is 1.42 eV and Eg of InGaAs which is less than 1.42 eV.

Eg of InGaP conventionally used in the emitter of the GaAs HBT is 1.89 eV as described above, but as another prior art, a special InGaP is known as described below. In the conventional InGaP, In and Ga randomly occupy the lattice sites of the column III element. However, by using a special growth condition or a growth method, it is possible to grow a crystal with a CuPt-type ordering, in which monolayers of GaP and InP are alternately arranged in a (111) direction of the crystal. The conventional InGaP is almost disordered. As described above, for the In content that gives a lattice constant matching with that of GaAs, that is, i in a range of 0.48 to 0.5 when the composition is described as $In_iGa_{1-i}P$, Eg is about 1.89 eV at room temperature. Hereinafter, the InGaP with Eg=1.89 eV and a lattice constant matching with that of GaAs is referred to as "conventional InGaP". On the other hand, as the CuPt-type ordering progresses, Eg decreases. Non-Patent Document 4 reports a method in which the growth temperature in the MOCVD method is raised to obtain an InGaP having the CuPt-type ordering. FIG. 4 in the aforementioned document shows the growth temperature dependence of Eg at room temperature. As the growth temperature increases, Eg decreases and becomes 1.86 eV at 650° C. However, if the growth temperature further increases, the CuPt-type ordering decreases again, and Eg starts to increase. As a method of growing InGaP with more CuPt-type ordering, an InGaP growth method is reported, which uses a so-called atomic layer epitaxial growth method in which In raw material gas and Ga raw material gas are alternately supplied (Non-Patent Document 5). According to the method, InGaP with the ordering progressed further to give Eg=1.76 eV can be obtained. Such an InGaP having the CuPt-type ordering had been known as a material before, but there is no example of using it for the emitter material of the GaAs HBT using the pseudomorphic-growth InGaAs as the base layer.

[Patent Document 1] Japanese Patent No. 6378398

[Non-Patent Document 1] P. M. Enquist, L. R. Ramberg, F. E. Najjar, W. J. Schaff and L. F. Eastman, *Applied Physics Letters, Volume* 49, Issue 3, Jul. 21, 1986, p. 179.

[Non-Patent Document 2] D. A. Ahmari, M. T. Fresina, Q. J. Hartmann, D. W. Barlage, P. J. Mares, M. Feng and G. E. Stillman, *IEEE Electron Device Letters, Volume* 17, Issue 5, May 1996, p. 226.

[Non-Patent Document 3] M. Zachau and W. T. Masselink, *Applied Physics Letters, Volume* 60, Issue 17, Apr. 27, 1992, p. 2098.

[Non-Patent Document 4] Q. Liu, S. Derksen, W. Prost, A. Lindner and F. J. Tegude, *Journal of Applied Physics, Volume* 79, Issue. 1, Jan. 1, 1996, p. 305.

[Non-Patent Document 5] N. El-Masry and S. M. Bedair, *Optical and Quantum Electronics*, Volume 23, 1991, 5909.

As mentioned above, a GaAs HBT using a pseudomorphic-growth InGaAs in a base layer may be expected to be used to improve characteristics of a power amplifier and the like compared to a case that GaAs is used in the base layer. However, InGaAs has a smaller band gap than GaAs. Therefore, when InGaP is used in the emitter layer, the discontinuity in the conduction band energy at the InGaP/InGaAs heterojunction interface is greater than that in the conduction band energy at the InGaP/GaAs heterojunction interface. In FIG. 38a and FIG. 38b, for the GaAs HBTs using GaAs and InGaAs as the base layer, respectively, the depth dependence of the conduction band energy near the junction between the base and the emitter calculated via two-dimensional device simulation is illustrated. There is a triangular spike-shaped energy barrier on the emitter layer side of the emitter layer/base layer heterojunction interface, but its height is as low as 24 meV in case of the GaAs base layer. This value is less than the thermal unit kT (k is Boltzmann constant, and T is an absolute temperature) at room temperature (300 K), that is, 26 meV. Moreover, in the vicinity of top of the triangular energy barrier, transmission of electrons caused by tunneling effect occurs, and the actual barrier height is further reduced. Therefore, in the case of the GaAs base layer, blocking of conduction electrons due to the spike-like energy barrier is negligibly small. However, in the case of the InGaAs base, the conduction band energy decreases as the band gap decreases, so as shown in FIG. 38b, the height of the spike-shaped energy barrier at the emitter layer/base layer heterojunction interface is as high as 105 meV. This value is equivalent to 4 times the thermal unit at room temperature. This conduction barrier must be crossed for conduction electrons to flow from the emitter layer into the base layer and reach the collector. When there is no energy barrier, as described above, since the band gap of InGaAs is smaller than that of GaAs, turn-on Vbe decreases, and good transistor characteristics are obtained. However, when InGaP is used in the emitter layer, the turn-on Vbe is determined by the energy barrier, thus greatly impairing the effect of reduction of the band gap obtained by using InGaAs for the base layer. For the purpose of the invention, a novel emitter-base semiconductor layer structure is provided.

SUMMARY

A GaAs HBT of the first invention of the application uses InGaAs grown by a pseudomorphic growth in a base layer, wherein InGaP having a CuPt-type ordering is used in an emitter layer.

In an exemplary form of the first invention of the application, the band gap of the InGaP having the CuPt-type ordering at room temperature is in a range of 1.76 eV to 1.86 eV.

In an exemplary form of the first invention of the application, an In content i when the composition of the InGaP having the CuPt-type ordering is described as $In_iGa_{1-i}P$ is set to be in a range of 0.48 to 0.5.

In an exemplary form of the first invention of the application, an In content j when the composition of the InGaAs base layer is described as $In_jGa_{1-j}As$ is set to be in a range of 0.05 to 0.12.

A GaAs HBT of the second invention of the application uses InGaAs grown by a pseudomorphic growth in a base layer, wherein a p-type impurity concentration of a pseudomorphic-growth InGaAs base layer on the emitter layer side (hereinafter referred to as a second InGaAs base layer) is less than a p-type impurity concentration of a pseudomorphic-growth InGaAs base layer on the collector layer side (hereinafter referred to as a first InGaAs base layer).

In an exemplary form of the second invention of the application, the p-type impurity concentration of the second InGaAs base layer is set to ½ or less compared with the p-type impurity concentration of the first InGaAs base layer.

In an exemplary form of the second invention of the application, the p-type impurity concentration of the first InGaAs base layer is set to $2 \times 10^{19}$ cm$^{-3}$ or above.

In an exemplary form of the second invention of the application, a thickness of the second InGaAs base layer is set to be in a range of 1 nm to 6 nm.

In an exemplary form of the second invention of the application, an average value of the In content j of the first InGaAs base layer and the second InGaAs base layer, when the composition of InGaAs is described as $In_jGa_{1-j}As$, is set to be in a range of 0.05 to 0.12.

In an exemplary form of the second invention of the application, an InGaP layer is used in the emitter layer.

DESCRIPTION OF THE EMBODIMENTS

According to an embodiment of the present invention, in the GaAs HBT using a pseudomorphic-growth InGaAs in the base layer, an influence of spike-shaped conduction band energy barrier at the emitter/base junction interface is reduced, and thus the turn-on Vbe is reduced. As a result, a high-frequency power amplifier with excellent basic characteristics such as PAE may be realized.

The implementations of the invention are described below with reference to the accompanying drawings.

Figure 1:
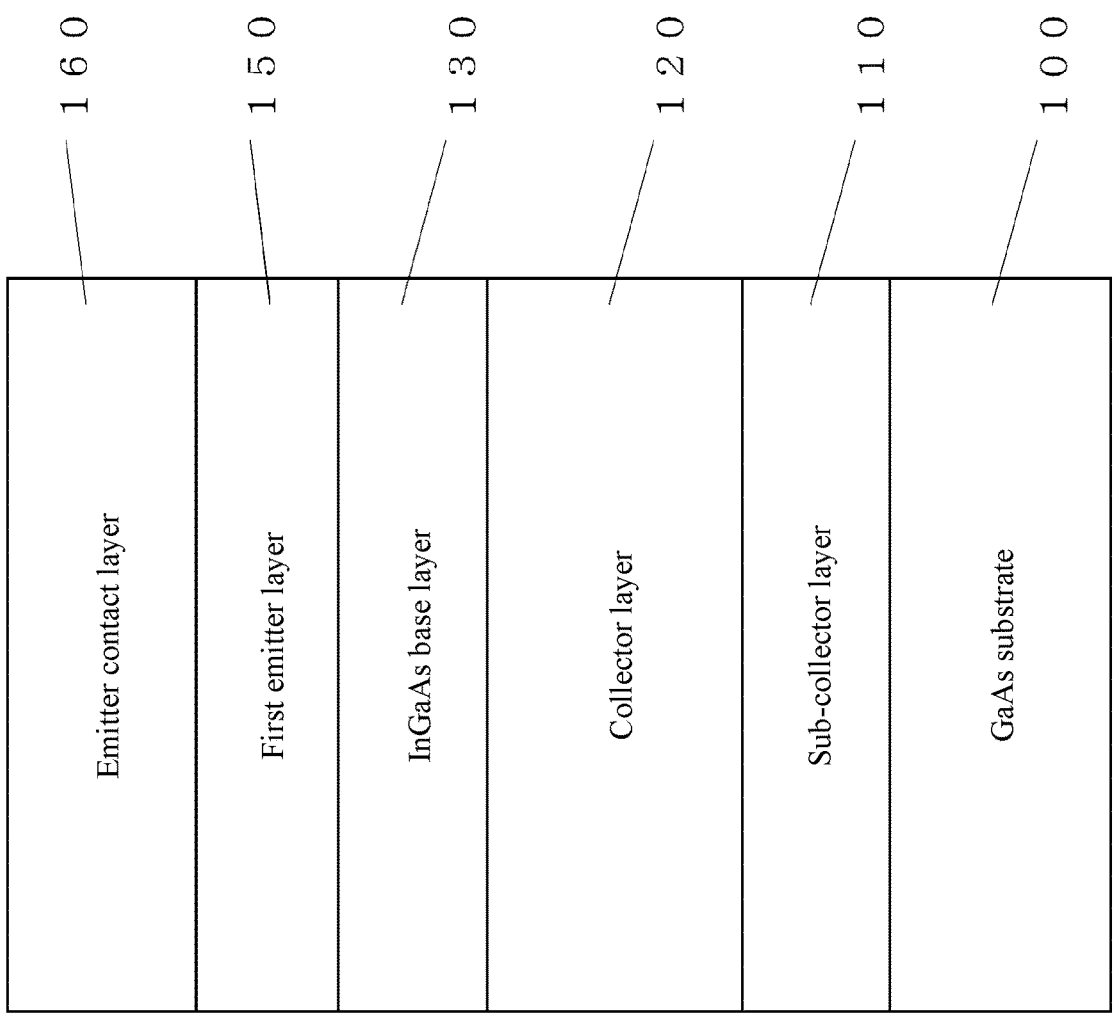
FIG. 1 illustrates a semiconductor layer structure showing the main constituting elements of a GaAs HBT according to the first invention of the application.

FIG. 1 illustrates a semiconductor layer structure of main constituting elements of a GaAs HBT according to the first invention of the application. On a GaAs substrate 100, a sub-collector layer 110, a collector layer 120, an InGaAs base layer 130, a first emitter layer 150, and an emitter contact layer 160 are formed by epitaxial growth. A plane orientation of the GaAs substrate 100 is (100). The sub-collector layer 110, the collector layer 120, the first emitter layer 150 and the emitter contact layer 160 are n-type semiconductors, and the InGaAs base layer 130 is a p-type semiconductor. The sub-collector layer 110, the collector layer 120, the InGaAs base layer 130, and the first emitter layer 150 constitute an essential part of an non-type transistor, and the layers all use semiconductor layers free of relaxation of strain caused by a lattice mismatch to GaAs. For the sub-collector layer 110 and the collector layer 120, for example, GaAs, i.e. the same material as the substrate, is used. Alternatively, other semiconductors, such as InGaP, AlGaAs, or a stacked structure of the semiconductors substantially having no lattice mismatch to GaAs may also be used. The InGaAs base layer 130 is grown by pseudomorphic growth without strain relaxation maintaining a compressive strain. For the first emitter layer 150, InGaP having a CuPt-type ordering is used. The CuPt-type ordering is a structure in which monolayers of GaP and InP are alternately arranged in a (111) direction of the crystal as described in a previous paragraph. The band gap (Eg) of the conventional InGaP matching the GaAs lattice is 1.89 eV, but for InGaP with the CuPt-type ordering, Eg is less than 1.89 eV and becomes smaller as the ordering proceeds. For a completely ordered ideal crystal, the In content i when a composition is described as $In_iGa_{1-i}P$ is 0.5, and the crystal is regarded as a compound represented by $InGaP_2$. However, for a practical purpose, there is no problem if i is within a range of 0.48 to 0.5. If i is within the above range, the lattice mismatch to GaAs is also negligible, and a layer without strain relaxation can be easily grown. An effect obtained by using InGaP having the CuPt-type ordering in the first emitter layer 150 will be described later.

Figure 2:
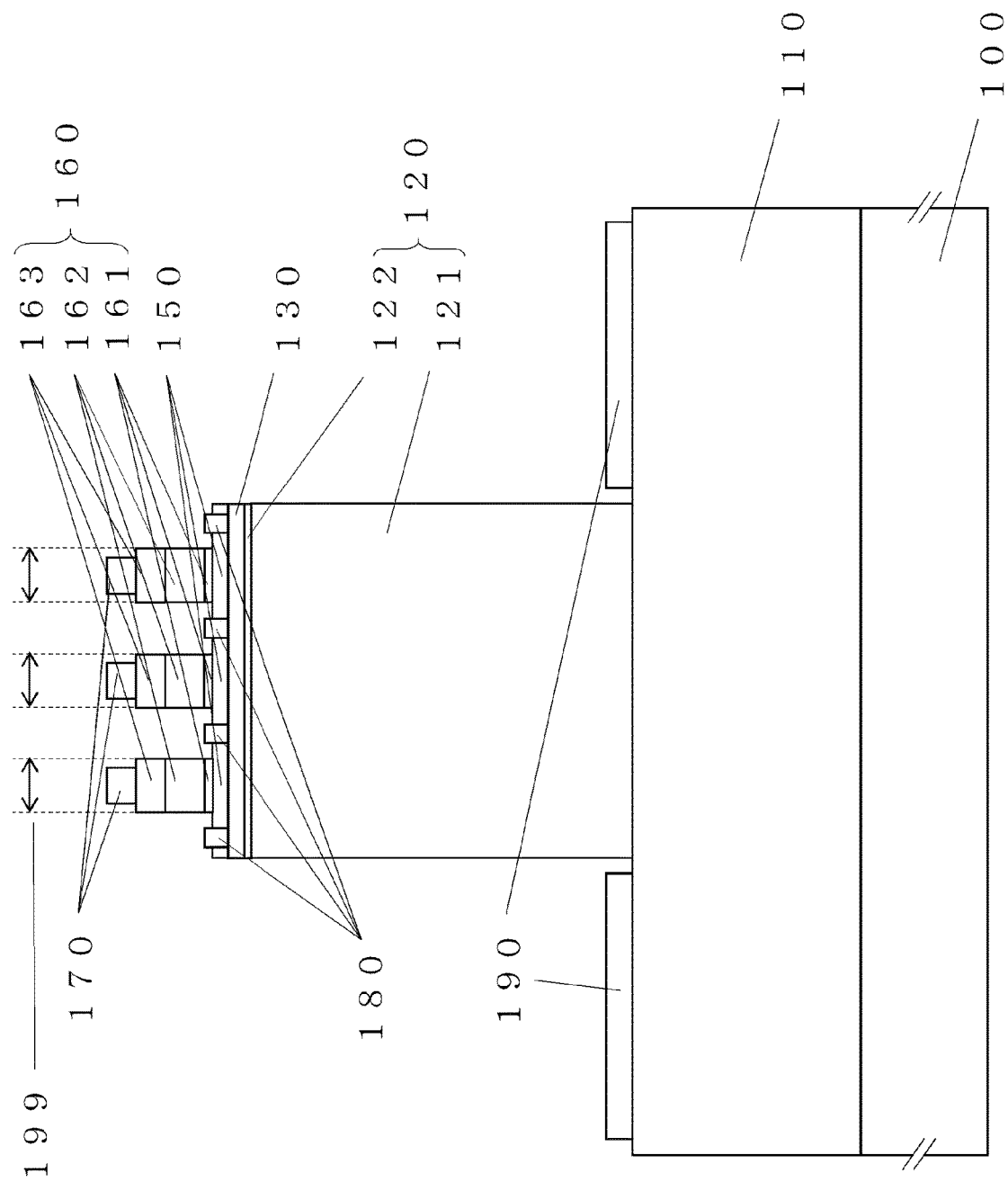
FIG. 2 illustrates a sectional structure of one embodiment of the GaAs HBT according to the first invention of the application with the main constituting elements shown in FIG. 1.

The sectional structure of the GaAs HBT shown in FIG. 2 is a typical example when the GaAs HBT having the main constituent elements shown in FIG. 1 is used as a power amplifier. In the present embodiment, the emitter is divided into three regions, and the width of each emitter shown by an arrow 199 in FIG. 2 is 3 microns. In addition, the size (length) of the emitter in the direction orthogonal to the paper surface is 40 microns. Therefore, the area of the emitter is 360 square microns. In the GaAs HBT shown in FIG. 2, an emitter electrode 170 is disposed on the emitter contact layer 160; a base electrode 180 is disposed on the InGaAs base layer 130; and a collector electrode 190 is disposed on the sub-collector layer 110. The electrical connection to each region of the transistor is made through those electrodes. In addition, in FIG. 2, the collector layer 120 consists of stacked two layers, and the emitter contact layer 160 consist of stacked three layers. Table 1 shows the conduction type, the type and concentration of impurity, and the thickness of each semiconductor layer including those in the stacked structures. The first collector layer 121 consists of GaAs. A second collector layer 122 has a composition gradient in such a way that it becomes GaAs on a first collector layer 121 side and becomes InGaAs on the InGaAs base layer 130 side. That is, In content k when the composition is described as $In_kGa_{1-k}As$ continuously changes in a way that it is approximately s 0 on the first collector layer 121 side and s 0.1 on the InGaAs base layer 130 side. The purpose of this composition gradient is to make the conduction band energy smoothly connected from the first collector layer 121 to the InGaAs base layer 130. The p-type impurity in the InGaAs base layer 130 is carbon (C) and its concentration is $4 \times 10^{19}$ cm$^{-3}$. In the embodiment shown in Table 1, the In content of the InGaAs base layer, that is, In content j when the composition is described as $In_jGa_{1-j}As$, is 0.1, and the thickness is 35 nm. As described in the paragraph explaining the prior art, a proper thickness is chosen for the InGaAs base layer according to the In content. The first emitter layer 150 consists of InGaP having a CuPt-type ordering, and In content i when the composition is described as $In_iGa_{1-i}P$ is 0.48. InGaP having the CuPt-type ordering has spontaneous polarization, and so if it is used in the first emitter layer 150, negative charges are generated on the surface of the emitter contact layer side. A high-concentration GaAs emitter contact layer 161 is a layer that contains an increased concentration of Si serving as an n-type impurity to counteract the negative charges caused by the spontaneous polarization, so as to suppress the rise of the conduction band energy due to the negative charges generated by the spontaneous polarization. In the present embodiment, all the semiconductor layers on the GaAs substrate 100 except the uppermost InGaAs emitter contact layer 163 are grown without substantial relaxation of strain caused by a lattice mismatch with GaAs. Thereby, a device having excellent characteristics owing to the absence of strain-relaxation-induced lattice defects can be obtained. In the InGaAs emitter contact layer 163, on the other hand, In content is made sufficiently high to obtain a good ohmic contact with the emitter electrode 170 shown in FIG. 2. Therefore, lattice defects are generated by the strain relaxation in the InGaAs emitter contact layer 163. However, by thickening the lower GaAs emitter contact layer 162 to 110 nm, the influence of the lattice defects is prevented from affecting the essential part of the device and degrading its characteristics.

Figure 3:
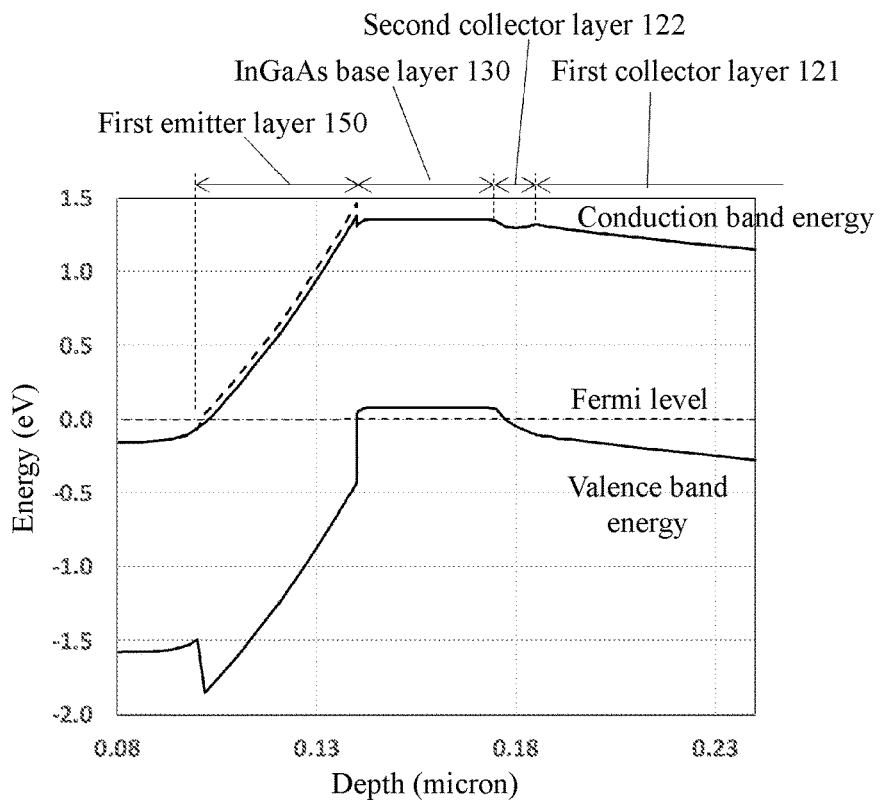
FIG. 3 is a diagram illustrating a depth dependence of conduction band energy, valence band energy and Fermi level for the GaAs HBT according to the first invention of the application shown in FIG. 2.
Figure 4:
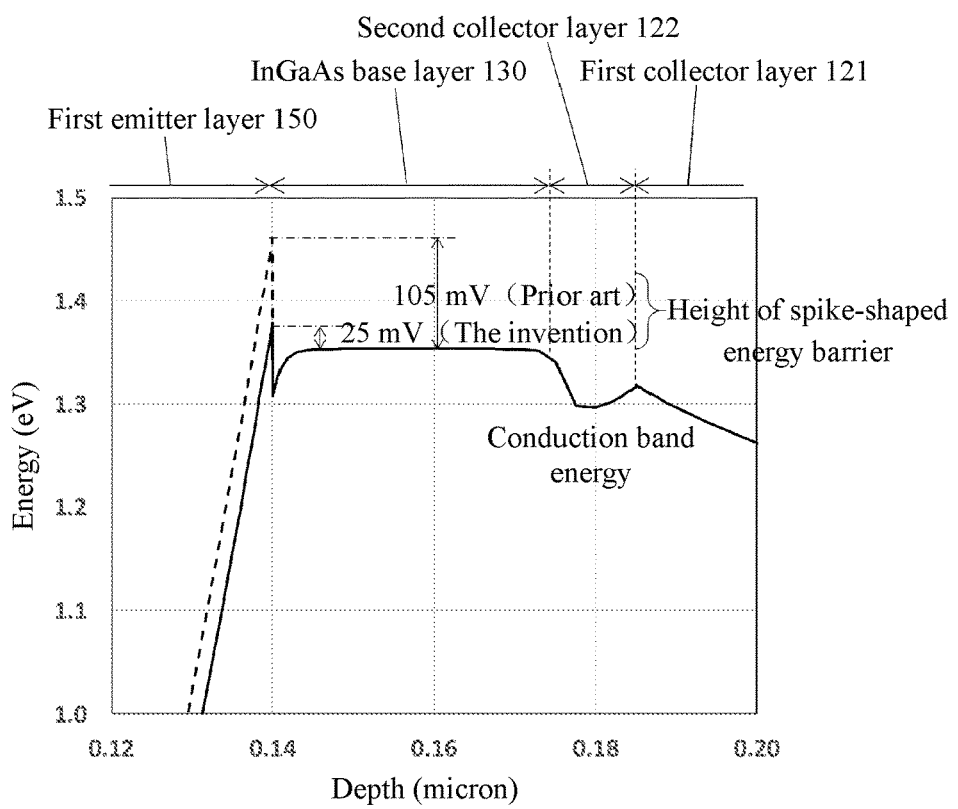
FIG. 4 is a diagram illustrating a depth dependence of the conduction band energy for the GaAs HBT according to the first invention of the application shown in FIG. 2.
Figure 5:
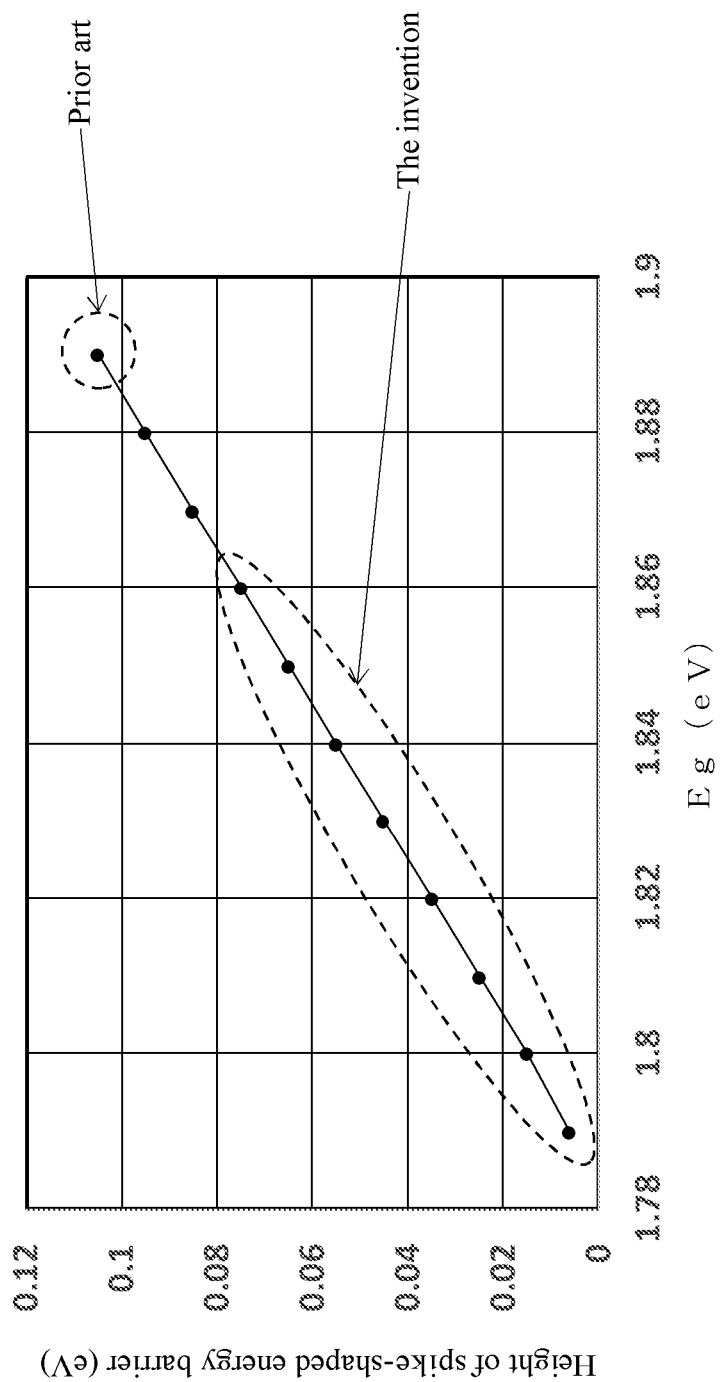
FIG. 5 is a diagram illustrating a relation between the height of spike-shaped energy barrier generated at the emitter-base junction and the band gap energy Eg of InGaP emitter layer for the GaAs HBT according to the first invention of the application shown in FIG. 2.
Figure 38A:
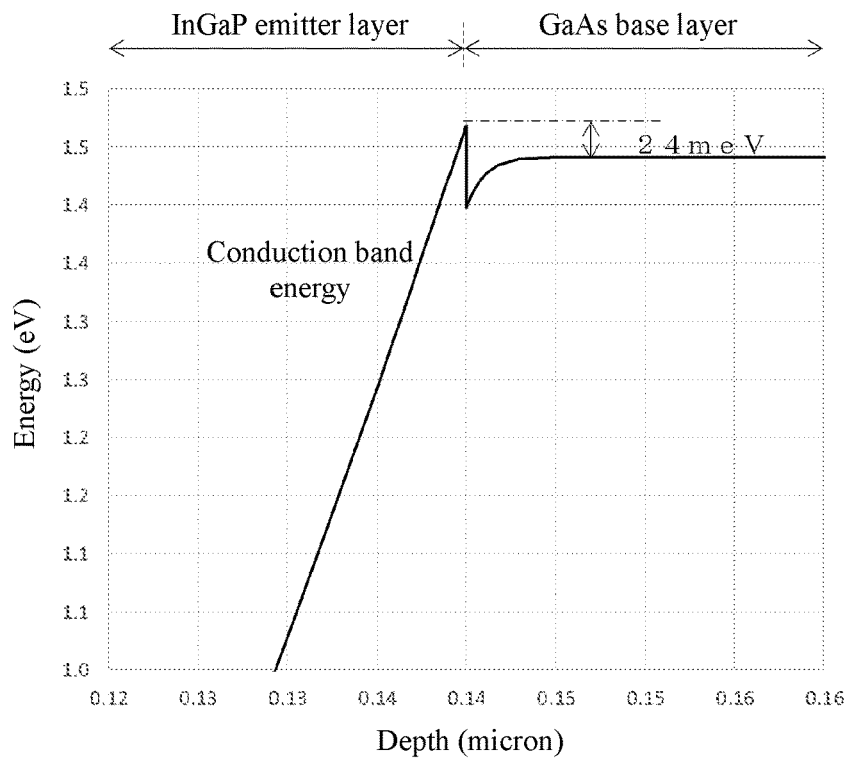
FIG. 38a is a diagram illustrating a depth dependence of conduction band energy for a conventional GaAs HBT using GaAs for a base layer.
Figure 38B:
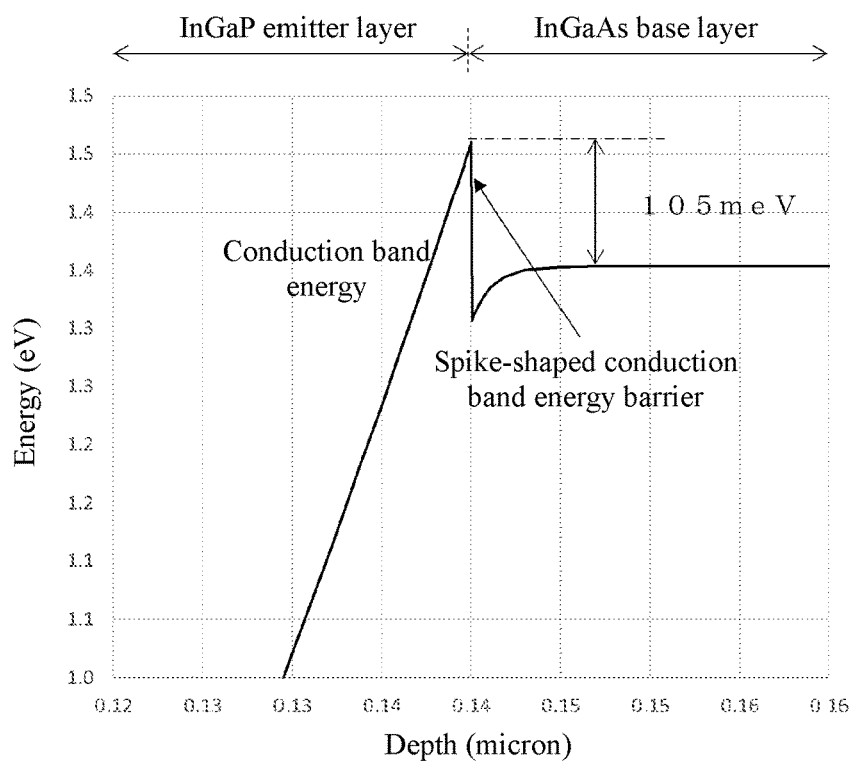
FIG. 38b is a diagram illustrating a depth dependence of conduction band energy for a conventional GaAs HBT using InGaAs for a base layer.

Hereinafter, effects of the first invention of the application will be described. First, the structure of the band energy for the GaAs HBT shown in FIG. 2 and Table 1 calculated by two-dimensional device simulation is described. FIG. 3 illustrates the depth dependence of conduction band energy, valence electron band energy, and Fermi level from the first emitter layer 150, through the InGaAs base layer 130 and the second collector layer 122, to the first collector layer 121. FIG. 4 is an enlarged view showing the depth dependence of the conduction band energy in the junction region. No voltage is applied to the transistor, so Fermi level is constant in depth as shown in FIG. 3. In FIG. 3 and FIG. 4, the first emitter layer 150 part is shown by a dotted line and a solid line. The dotted line is a case where the first emitter layer 150 is replaced with an emitter layer consisting of a conventional InGaP. The height of the spike-shaped energy barrier is 105 meV as also shown in FIG. 38b for the example of a prior art. On the other hand, the solid line is a case for the GaAs HBT of the invention where InGaP having the CuPt-type ordering with a band gap (Eg) of 1.81 eV at room temperature is used for the first emitter layer 150. First, the valence band energy shown in FIG. 3 is discussed below. The valence band energy in the first emitter layer 150 is almost the same for the present invention using InGaP layer having the CuPt-type ordering and the case replaced with the conventional InGaP layer, so the valence band energy is in an overlapped expression. The band gap reduction caused by the ordering is mostly caused by the reduction of the conduction band energy, and the valence band energy remains unchanged (Non-Patent Document 4). Suppression of hole injection from the base layer into the emitter layer caused by a barrier formed by the emitter layer valence band is the feature characterizing HBTs. For the InGaP emitter layer of the present invention, the barrier effect same as that of the conventional InGaP emitter layer is obtained. Next, the conduction band energy is discussed. As shown in FIG. 4, the height of spike-shaped energy barrier at the interface between the first emitter layer 150 and the InGaAs base layer 130 is 105 meV when the first emitter layer 150 is replaced with the conventional InGaP (the dotted line), whereas the height for the present invention where InGaP having the CuPt-type ordering is used for the emitter layer (the solid line) is much lower. When Eg is 1.81 eV as in the case shown in FIG. 4, the height of the spike-shaped energy barrier is 25 meV. This height is the same as that of the spike-shaped energy barrier for the GaAs base layer shown in FIG. 38a, so the influence of the barrier almost disappears. FIG. 5 is a diagram illustrating a relation between the height of the spike-shaped energy barrier shown in FIG. 4 and Eg of InGaP having the CuPt-type ordering used for the first emitter layer 150. A point for Eg equal to 1.89 eV is equivalent to the case where the conventional InGaP is used in the emitter layer. When InGaP having the CuPt-type ordering is used in the emitter layer, Eg decreases according to the degree of ordering, and the height of the spike-shaped energy barrier decreases as a result. In FIG. 4, the data points with Eg less than or equal to 1.86 eV are labeled "the invention". This is because a particularly significant characteristics improvement can be obtained when Eg is 1.86 eV or less. The specific explanation thereof will be given in the description of FIG. 11.

TABLE 1

| Code number | Type | Conduction type | Type of impurity | Concentration of impurity (cm$^{-3}$) | Thickness (nm) |
|---|---|---|---|---|---|
| 163 | InGaAs emitter contact layer | n-type | Si | >5 × 10$^{18}$ | 80 |
| 162 | GaAs emitter contact layer | n-type | Si | 5 × 10$^{18}$ | 110 |
| 161 | High-concentration GaAs emitter contact layer | n-type | Si | >5 × 10$^{18}$ | 10 |
| 150 | First emitter layer | n-type | Si | 3 × 10$^{17}$ | 40 |
| 130 | InGaAs base layer (In$_j$Ga$_{1-j}$As, j = 0.1) | p-type | C | 4 × 10$^{19}$ | 35 |
| 122 | Second collector layer (In$_k$Ga$_{1-k}$As, k = 0 – 0.1) | n-type | Si | 1 × 10$^{15}$ | 10 |
| 121 | First collector layer (GaAs) | n-type | Si | 1 × 10$^{15}$- 1 × 10$^{17}$ | 1000 |
| 110 | Sub-collector layer (GaAs) | n-type | Si | 5 × 10$^{18}$ | 600 |
| 100 | GaAs substrate | Semi-insulating | — | — | — |

Figure 6:
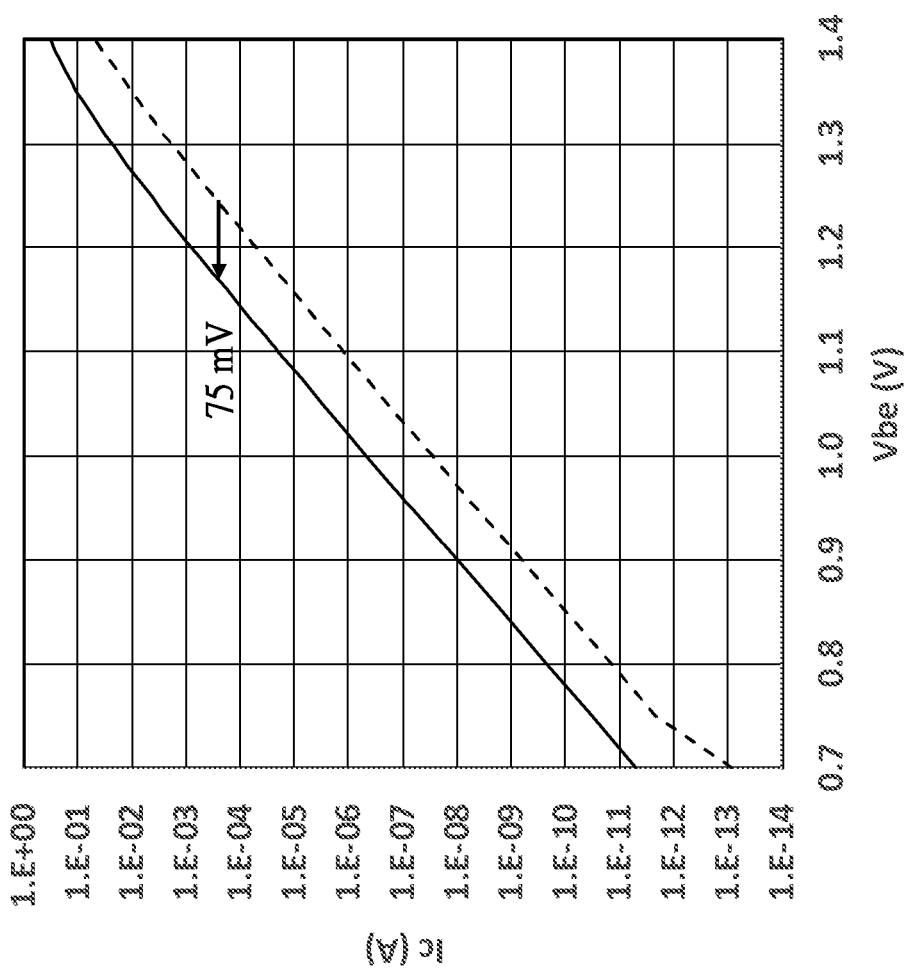
FIG. 6 is a diagram illustrating a Vbe dependence of the collector current Ic when the same positive voltage Vbe is applied to the base and the collector for the GaAs HBT according to the first invention of the application shown in FIG. 2.
Figure 7:
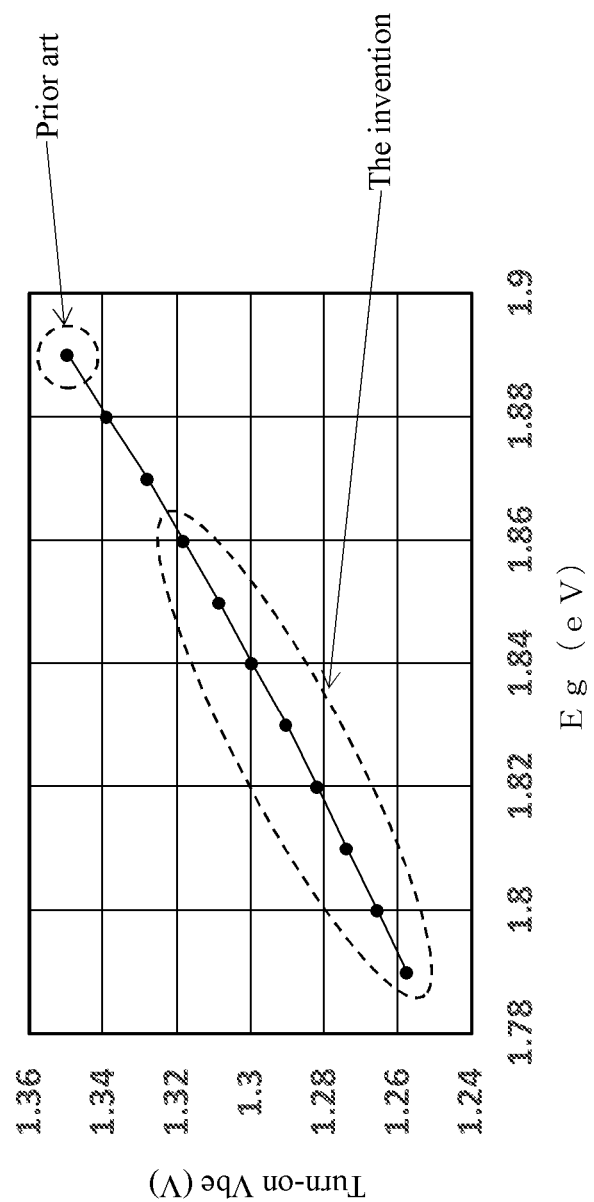
FIG. 7 is a diagram illustrating a relation between the turn-on Vbe and the band gap energy Eg of InGaP emitter layer for the GaAs HBT according to the first invention of the application shown in FIG. 2.

Next, direct current (DC) characteristics of the GaAs HBT shown in FIG. 2 and Table 1, which are calculated through two-dimensional device simulation, are described. FIG. 6 illustrates a Vbe dependence of collector current Ic when the emitter electrode 170 in the GaAs HBT shown in FIG. 2 is grounded and the same positive voltage Vbe is applied to the base electrode 180 and the collector electrode 190, which are the Ic characteristics obtained through the measurement of so-called Gummel plot. As in FIG. 3 and FIG. 4, the dotted line indicates the case where the first emitter layer 150 is replaced with the emitter layer consisting of conventional InGaP. The solid line, on the other hand, is the case of the GaAs HBT of the invention, where InGaP having the CuPt-type ordering with the band gap of 1.81 eV at room temperature is used for the first emitter layer 150. The Vbe where Ic reaches a certain determined value is turn-on Vbe. The two Ic curves in FIG. 6 show a horizontal shift of 75 mV. This means that the turn-on Vbe of the invention is 75 mV lower than that for the prior art irrespective of the current that defines its value. This change is caused by the height of the spike-shaped energy barrier shown in FIG. 4, which is decreased by 80 meV from 105 meV to 25 meV. FIG. 7 is a diagram illustrating a relation between the turn-on Vbe and Eg of InGaP. The point where Eg is equal to 1.89 eV indicates the case where the first emitter layer 150 is replaced with an emitter layer consisting of conventional InGaP. As Eg decreases, that is, as the CuPt-type ordering increases, the turn-on Vbe decreases. In FIG. 7, the data points with Eg of 1.86 eV or less are labeled "the invention". The reason for this is that a particularly significant characteristics improvement can be obtained when Eg is 1.86 eV or less, and the specific explanation thereof will be given in the description of FIG. 11.

Figure 8:
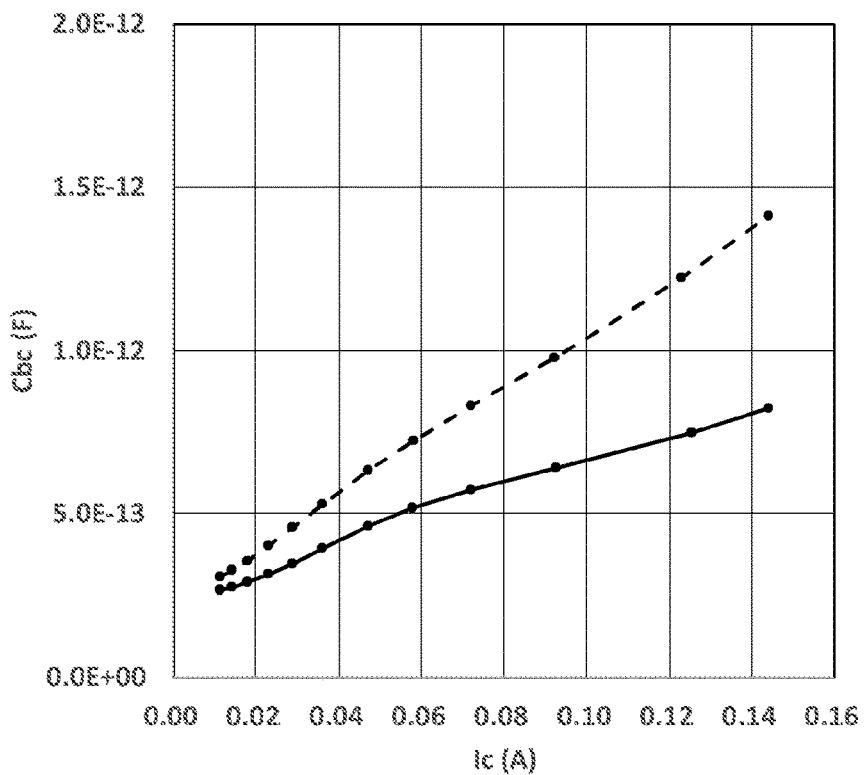
FIG. 8 is a diagram illustrating a collector current Ic dependence of the base-collector capacitance Cbc for the GaAs HBT according to the first invention of the application shown in FIG. 2.

Next, high-frequency characteristics of the GaAs HBT shown in FIG. 2 and Table 1, which are calculated through two-dimensional device simulation, are described. FIG. 8 is a diagram illustrating a collector current Ic dependence of base-collector capacitance Cbc. The voltage Vce between the collector and the emitter is fixed at 0.5 V, and the voltage Vbe between the base and the emitter is varied to obtain the Ic dependence. Cbc is calculated at frequency f0=2 GHz by using the following formula derived from a Y parameter.

$$Cbc = -Im(Y12)/(2\pi f0)$$

Figure 9:
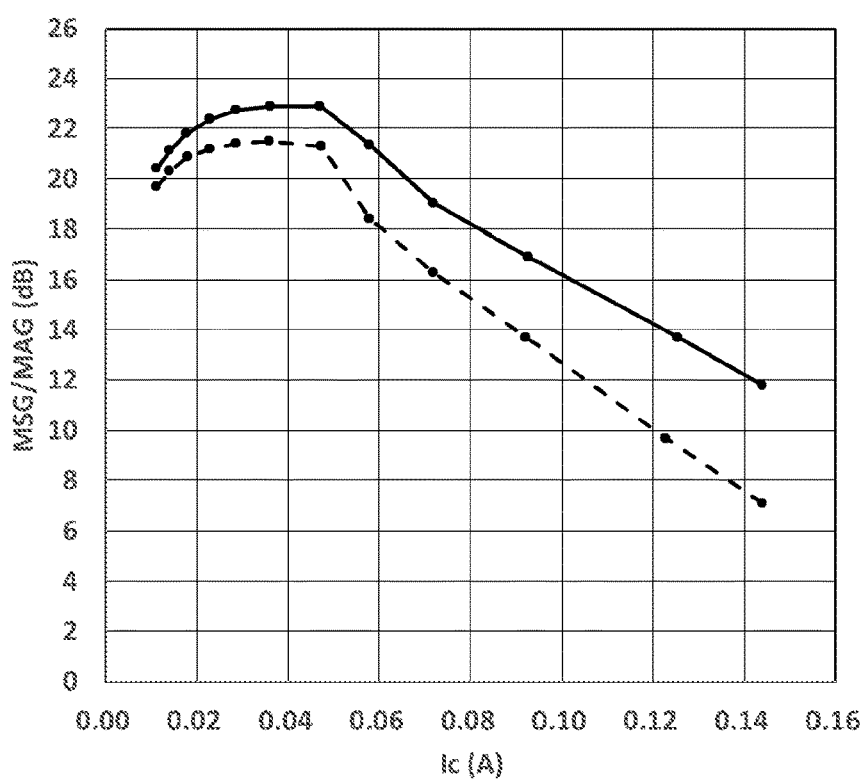
FIG. 9 is a diagram illustrating a collector current Ic dependence of the power gain MSG/MAG for the GaAs HBT according to the first invention of the application shown in FIG. 2.
Figure 10:
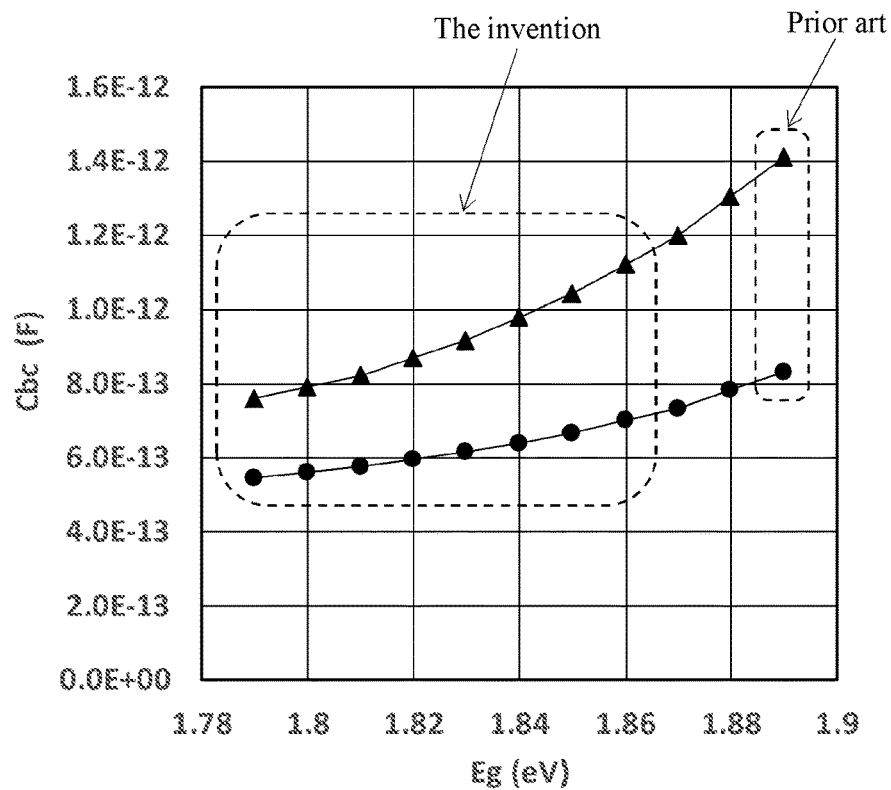
FIG. 10 is a diagram illustrating a relation between the base-collector capacitance Cbc and the band gap energy Eg of InGaP emitter layer for the GaAs HBT according to the first invention of the application shown in FIG. 2.
Figure 11:
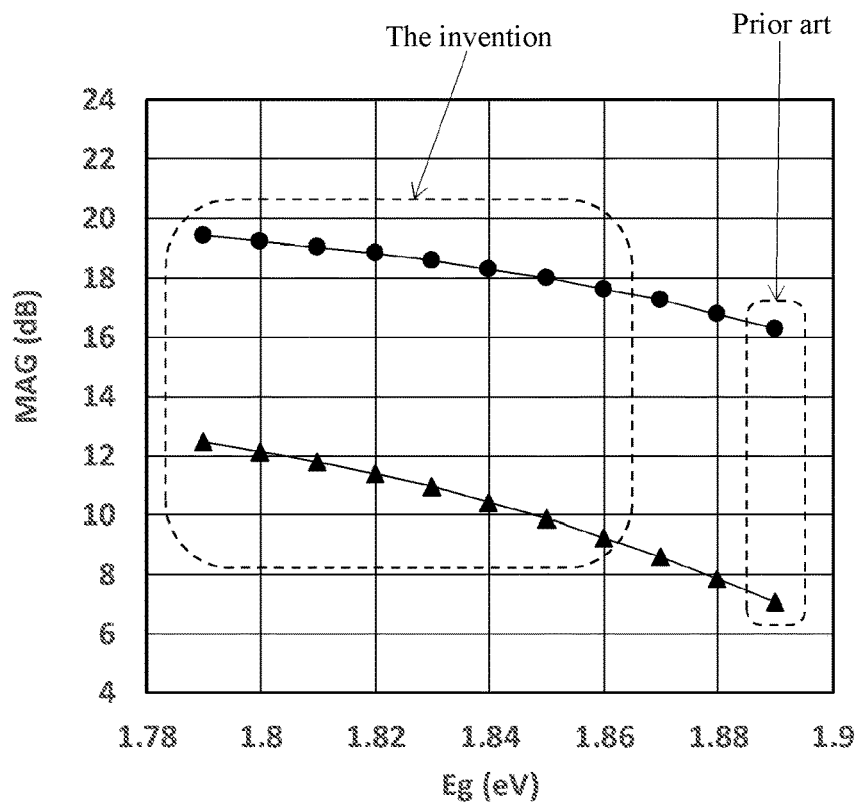
FIG. 11 is a diagram illustrating a relation between the power gain MAG and the band gap energy Eg of InGaP emitter layer for the GaAs HBT according to the first invention of the application shown in FIG. 2.

Here, Im (Y12) is an imaginary part of the Y parameter component Y12, and π is the Pi (circle ratio). The dotted line indicates the case where the first emitter layer 150 is replaced with an emitter layer consisting of conventional InGaP, and the solid line indicates the case of the present invention where the InGaP having CuPt-type ordering is used for the emitter, particularly the case where Eg at room temperature is 1.81 eV. All of the data points shown in FIG. 8 are for Ic 0.01 A or above, and so enter the "low Vbe region" shown in FIG. 37. As is clear from FIG. 6, Vbe at Ic of 0.01 A or above exceeds 1.25 V. Since Vce is 0.5 V, Vbc is 0.75 V or above, which means that the pn junction between the base and the collector is in a high forward bias state. Therefore, in the case of the conventional GaAs HBT shown by the dotted line in FIG. 8, as Ic increases with increasing forward bias, Cbc becomes high exceeding 1 pF. In the case of GaAs HBT of the invention, Cbc is significantly reduced, and the reduction is more pronounced for the higher Ic. The reason for this is that the forward bias between the base and the collector becomes smaller due to the reduction of the turn-on Vbe. FIG. 9 illustrates an Ic dependence of maximum power gain at frequency f0=2 GHz. As in the case of Cbc in FIG. 8, the collector voltage Vce is 0.5 V. The vertical axis is labeled MSG/MAG, where MSG is Maximum Stable Gain and MAG is Maximum Available Gain. MAG is the maximum power gain defined when a transistor meets a stability criterion that does not generate oscillation. On the other hand, in conditions where the transistor does not meet the stability criterion, the maximum power gain is defined as a value (MSG) obtainable by stabilization forced via an external element. In FIG. 9, the slope of the curve changes suddenly at Ic equal to 0.05 A. The region below 0.05 A is the MSG region, and the region above 0.05 A is the MAG region. In FIG. 9, the solid line is the GaAs HBT of the invention, where Eg of the InGaP emitter layer at room temperature is 1.81 eV. Compared with the case of the conventional GaAs HBT shown by the dotted line, MSG/MAG is high regardless of the current. This is because of the reduction of Cbc shown in FIG. 8. Cbc acts as a feedback capacitor in power amplification and reduces transistor's power gain. Especially in the "low Vce region", the pn junction between the base and the collector becomes strongly forward biased, so Cbc becomes very large, thus becoming a dominant cause of reduction of the power gain. According to the present invention, Cbc can be significantly reduced in the "low Vce region", and the reduction in the power gain in this region can be suppressed. FIG. 10 illustrates a relation between Cbc and Eg, and FIG. 11 illustrates a relation between the maximum power gain and Eg. Vce is 0.5 V. The data points shown by black dots are for Ic=0.072 A, and the data points shown by black triangles are for Ic=0.144 A. Ic=0.072 A and Ic=0.144 A both enter the "low Vce region" shown in FIG. 37. Since the emitter area is 360 square microns, the Ic converted to the average current density in the emitter plane is 20 kA/cm$^2$ and 40 kA/cm$^2$, respectively. In FIG. 11, in both cases of Ic=0.072 A and 0.144 A, the maximum power gain is in the MAG region, so the vertical axis is labeled MAG. In FIG. 10 and FIG. 11, a data point labeled "prior art" is the case where the first emitter layer 150 is replaced with the conventional InGaP. With the CuPt-type ordering in InGaP, Eg decreases; and as a result, Cbc decreases and MAG increases. In order to obtain an appreciable effect of the invention, in case of Ic=0.072 A (20 kA/cm$^2$), MAG should be improved by 1 dB or more; and in case of Ic=0.144 A (40 kA/cm$^2$), MAG should be improved by 2 dB or more. The Eg range of 1.86 eV or less satisfies the above condition, and is labeled "the invention" in FIG. 11. In FIG. 5, FIG. 7, and FIG. 10, the region with Eg less than or equal to 1.86 eV is also labeled "the invention". Non-Patent Document 5 reports the growth of InGaP in which the CuPt-type ordering reaches the level of Eg=1.76 eV. The first invention of the application also provides an appreciable effect for Eg in a range of 1.76 eV to 1.86 eV.

Figure 12:
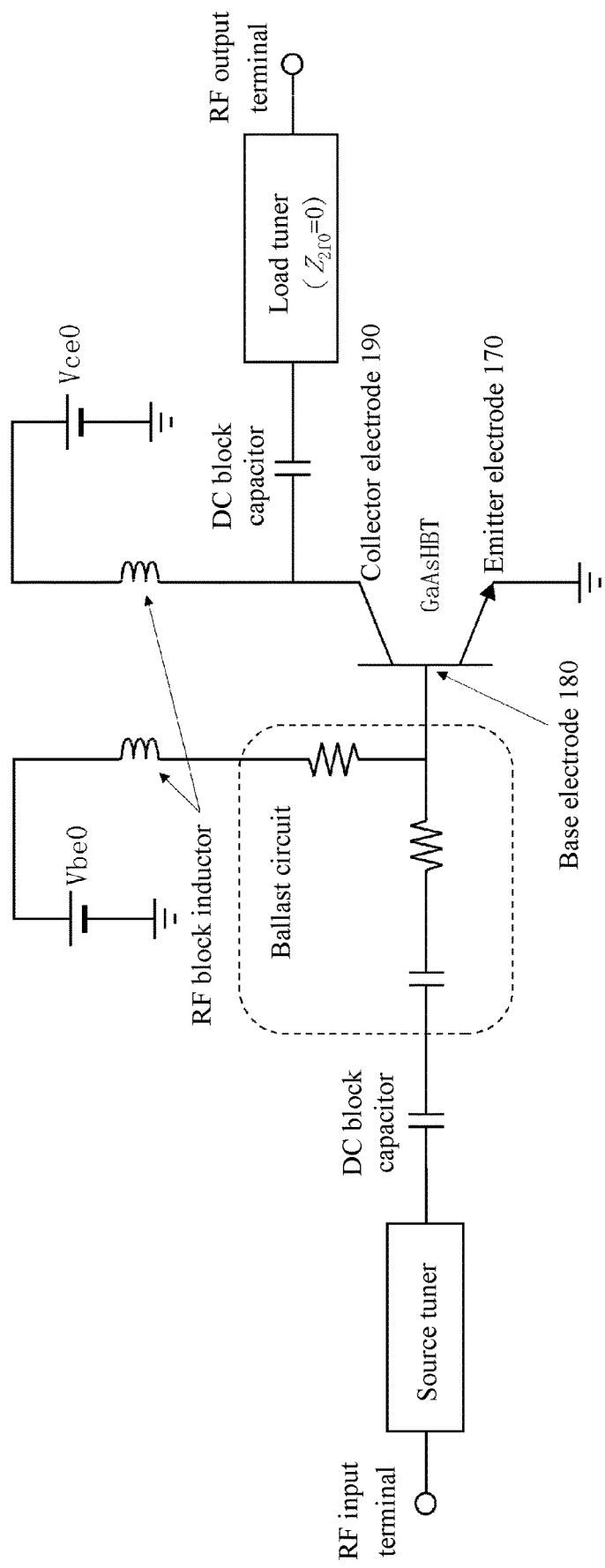
FIG. 12 is a diagram illustrating a characteristics analysis circuit for a power amplifier using a GaAs HBT.
Figure 13:
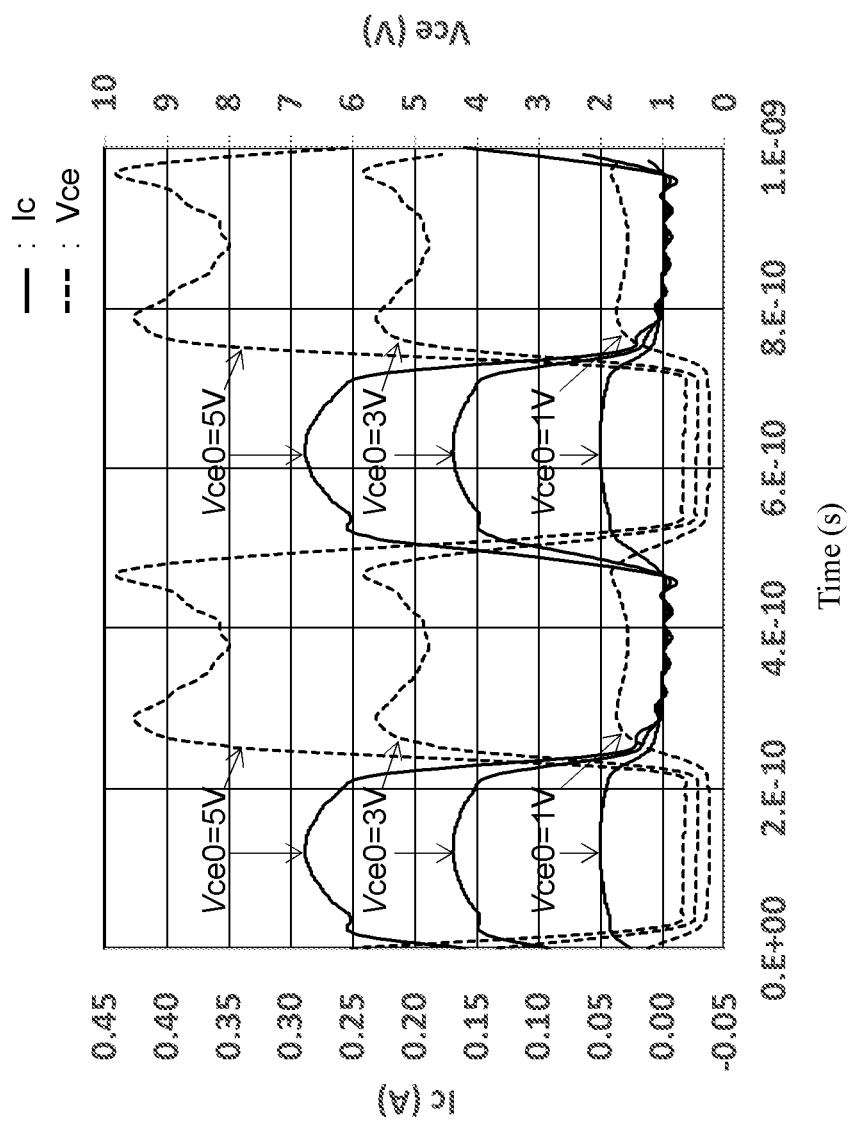
FIG. 13 is a diagram illustrating a time variation of the collector current Ic and the collector-emitter voltage Vce for a power amplifier using the GaAs HBT according to the first invention of the application shown in FIG. 2 operated via the characteristics analysis circuit shown in FIG. 12.
Figure 14:
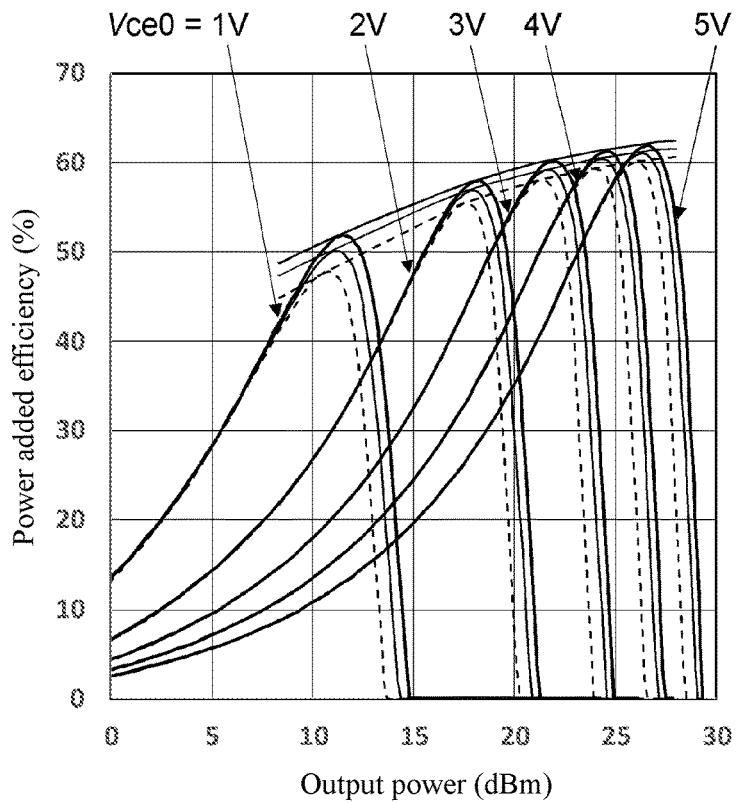
FIG. 14 is a diagram illustrating an output power dependence of power added efficiency (PAE) for a power amplifier using the GaAs HBT according to the first invention of the application shown in FIG. 2 operated via the characteristics analysis circuit shown in FIG. 12.
Figure 15:
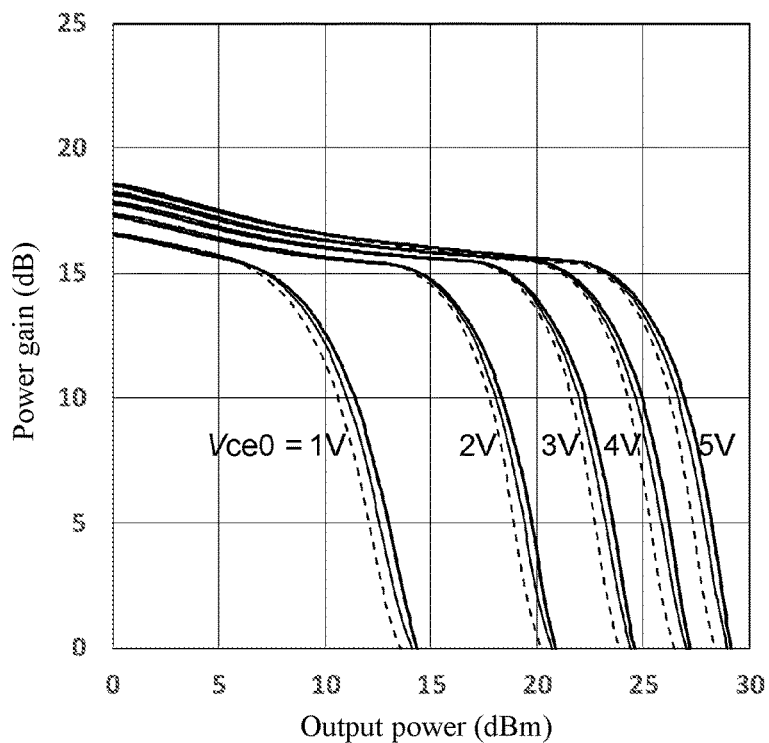
FIG. 15 is a diagram illustrating an output power dependence of power gain for a power amplifier using the GaAs HBT according to the first invention of the application shown in FIG. 2 operated via the characteristics analysis circuit shown in FIG. 12.
Figure 37:
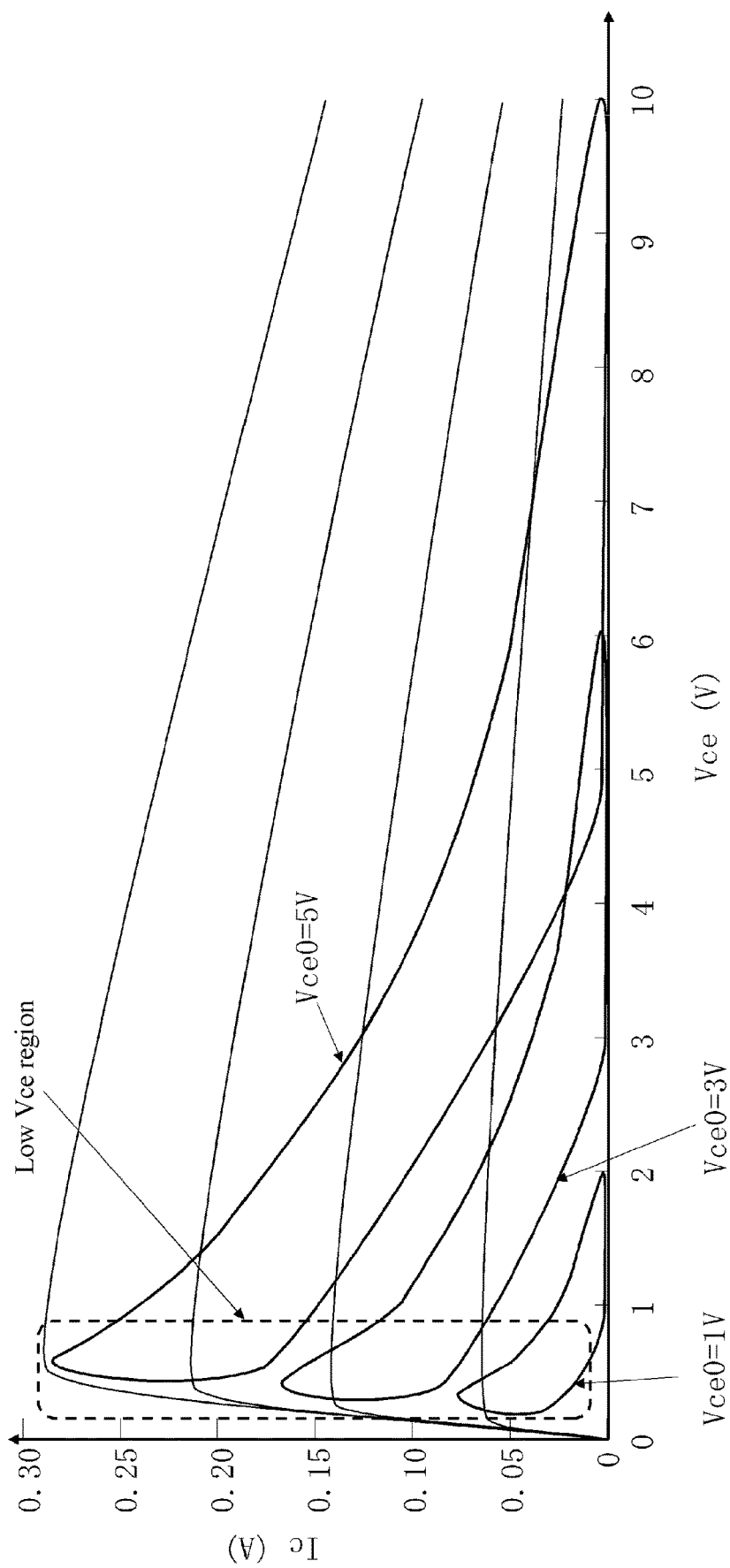
FIG. 37 schematically shows a diagram of curves denoting current-voltage characteristics for a collector current (Ic) and a voltage (Vce) between a collector and an emitter of a GaAs HBT for a plurality of different base currents (Ib) (thin solid lines), and load curves for a transistor operating as a power amplifier (thick solid lines).

Next, an improvement of power amplifier characteristics for the amplifier using the GaAs HBT of the first invention of the application shown in FIG. 2 and Table 1 is described. FIG. 12 is a characteristics analysis circuit called load-pull/source-pull circuit employed for the analysis of the power amplifier using the GaAs HBT. The base electrode 180, which is connected to an RF input terminal, is also connected with a ballast circuit consisting of a resistor and a capacitor for the transistor to be stabilized against oscillation and temperature rise. On the RF input terminal side, a source tuner is inserted through a DC block capacitor that blocks a DC voltage and allows only an RF signal to pass. The source tuner is used to obtain an impedance matching with the input impedance of the transistor to obtain a high power gain. On the other hand, a load tuner is inserted between the collector electrode 190 and an RF output terminal via a DC block capacitor. The load tuner is used to obtain an impedance matching with the output impedance of the transistor to obtain a high peak value for the power added efficiency (PAE) in a saturated output power. In order to suppress the power loss caused by second harmonics (2f0 where the frequency of fundamental waves is f0), the impedance at 2f0 (described as $Z_{2f0}$) in FIG. 12) is set to substantially zero. The impedance of other harmonic components is set to 50 ohms. For the base electrode 180 and the collector electrode 190, a DC bias voltage Vbe0 and a DC bias voltage Vce0 are applied via an RF block inductor that blocks an RF voltage and allows only a DC voltage to pass. The results described below is the case where the device with an emitter area of 360 square microns shown in FIG. 2 and Table 1 is used as the GaAs HBT. Vbe0 is adjusted to set Ic equal to 6 mA in the absence of RF input power. The operating frequency f0 is set to 2 GHz, and the impedance matching is made at Vce0=3V for both the source tuner and the load tuner. FIG. 13 is a diagram showing the variation of Ic and Vce with time (horizontal axis) during the RF operation for the GaAs HBT of the invention. The band gap of InGaP used for the first emitter layer is 1.81 eV. The solid line is Ic, and the dotted line is Vce. Both the solid line and the dotted line express three curves, which are curves when Vce0 is 1 V, 3 V, and 5 V, respectively. These curves are for the case when PAE is at its maximum in a saturated power operation. The overlap between Ic and Vce is small, which means that the power loss is low. This is an effect obtained by setting the impedance for the second harmonics 2f0 to be zero or the like in the load tuner. The peak value of Ic is about 0.05 A in the case of Vce0=1 V, about 0.17 A in the case of Vce0=3 V, and about 0.28 A in the case of Vce0=5 V. On the other hand, Vce is about 0.5 V when Ic is at its peak. This means that the GaAs HBT is operated in the "low Vce region" described in FIG. 37 for Ic at its peak. FIG. 14 illustrates the output power dependence of PAE, and FIG. 15 illustrates the output power dependence of power gain. FIG. 14 and FIG. 15 show the characteristics for the collector DC bias voltage Vce0 at 1 V, 2 V, 3 V, 4 V, and 5 V. For all of Vce0, the dotted line shows the case for the conventional GaAs HBT where the first emitter layer 150 is replaced with the conventional InGaP layer. On the other hand, the thin solid line and the thick solid line show the cases for the GaAs HBT of the invention. The thin solid line is the case where InGaP having the CuPt-type ordering with the band gap Eg of 1.85 eV is used for the first emitter layer, and the thick solid line is the case where InGaP having the CuPt-type ordering with Eg of 1.81 eV is used for the first emitter layer. FIG. 14 also shows a line that connects the peaks of PAE. The peak value of PAE for the GaAs HBT of the invention is greater than that of the conventional GaAs HBT for any Vce0, and the difference is as large as 4% when Eg is 1.81 eV. This is because of the reduced Cbc and the larger power gain as a result in the "low Vce region" for the GaAs HBT of the invention. The increase in PAE is more obvious for the lower Vce0. The reason for this is that, as shown in FIG. 37, if Vce0 is low, the portion of the load curve that enters the "low Vce region" increases. As also described in the explanation of the prior art, Vce0 changes dynamically in the envelope tracking type power amplifier according to the modulation signal amplitude; Vce0 increases at a high output power and decreases at a low output power. Thus, the transistor is always operated in the saturated power region where PAE is maximum. As shown in FIG. 14, the peak PAE of the GaAs HBT of the invention is higher than that of the conventional GaAs HBT for any Vce0. In addition, the power gain of the invention is also greater than that of the conventional GaAs HBT as shown in FIG. 15. Therefore, by using the GaAs HBT of the invention, the characteristics can be significantly improved for a power amplifier operated in the power saturation region particularly like the envelope tracking amplifier.

Figure 16:
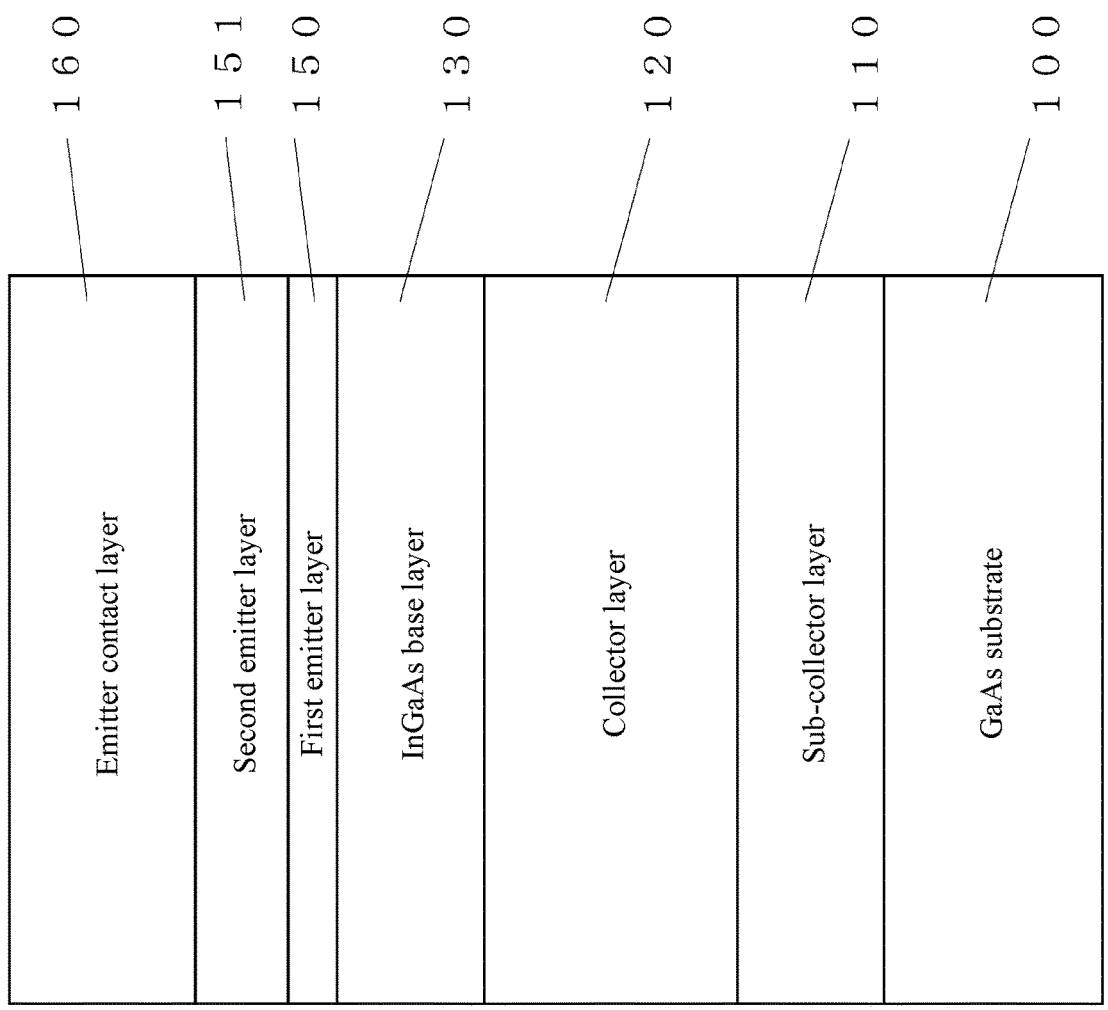
FIG. 16 illustrates a semiconductor layer structure of main constituting elements for another embodiment of the GaAs HBT according to the first invention of the application.

In the embodiment of the first invention of the application described above, the CuPt-type ordering in the InGaP layer used for the first emitter layer 150 is uniform, and the band gap is constant. As another embodiment of the first invention of the application, the CuPt-type ordering may be non-uniform in such a way that it is high near the interface with the InGaAs base layer 130 and is becoming gradually lower in a region away from the interface. Thereby, polarization charges may be dispersed, and the influence of the rise of conduction band energy caused by the negative polarized charges may be reduced. Alternatively, as shown in FIG. 16, a second emitter layer 151 may be disposed between the first emitter layer 150 and the emitter contact layer 160. The first emitter layer 150 is set to be InGaP having the CuPt-type ordering, and the second emitter layer 151 is set to be the conventional InGaP. Thereby, it is possible to maintain other characteristics of the GaAs HBT using the conventional InGaP for the emitter layer, while the height of the spike-shaped energy barrier at the interface with the InGaAs base layer 130 is lowered to reduce the turn-on Vbe. In addition, in FIG. 16, the second emitter layer 151 may also be formed by a semiconductor other than InGaP, such as AlGaAs. Furthermore, an n-type impurity concentration near the interface between the first emitter layer 150 and the second emitter layer 151 may also be increased to reduce the influence of the negative polarization charges generated on the second emitter layer 151 side of the first emitter layer 150 surface.

In the embodiment of the first invention of the application described above, the In content of the InGaAs base layer 130, that is, In content j when the composition is described as $In_jGa_{1-j}As$, is 0.1. However, the same effect may be achieved as long as j is within a range of 0.05 to 0.12. Alternatively, the average value of j in the film is within a range of 0.05 to 0.12, whereas a gradient may be added to the value of j in a direction perpendicular to the film.

Figure 17:
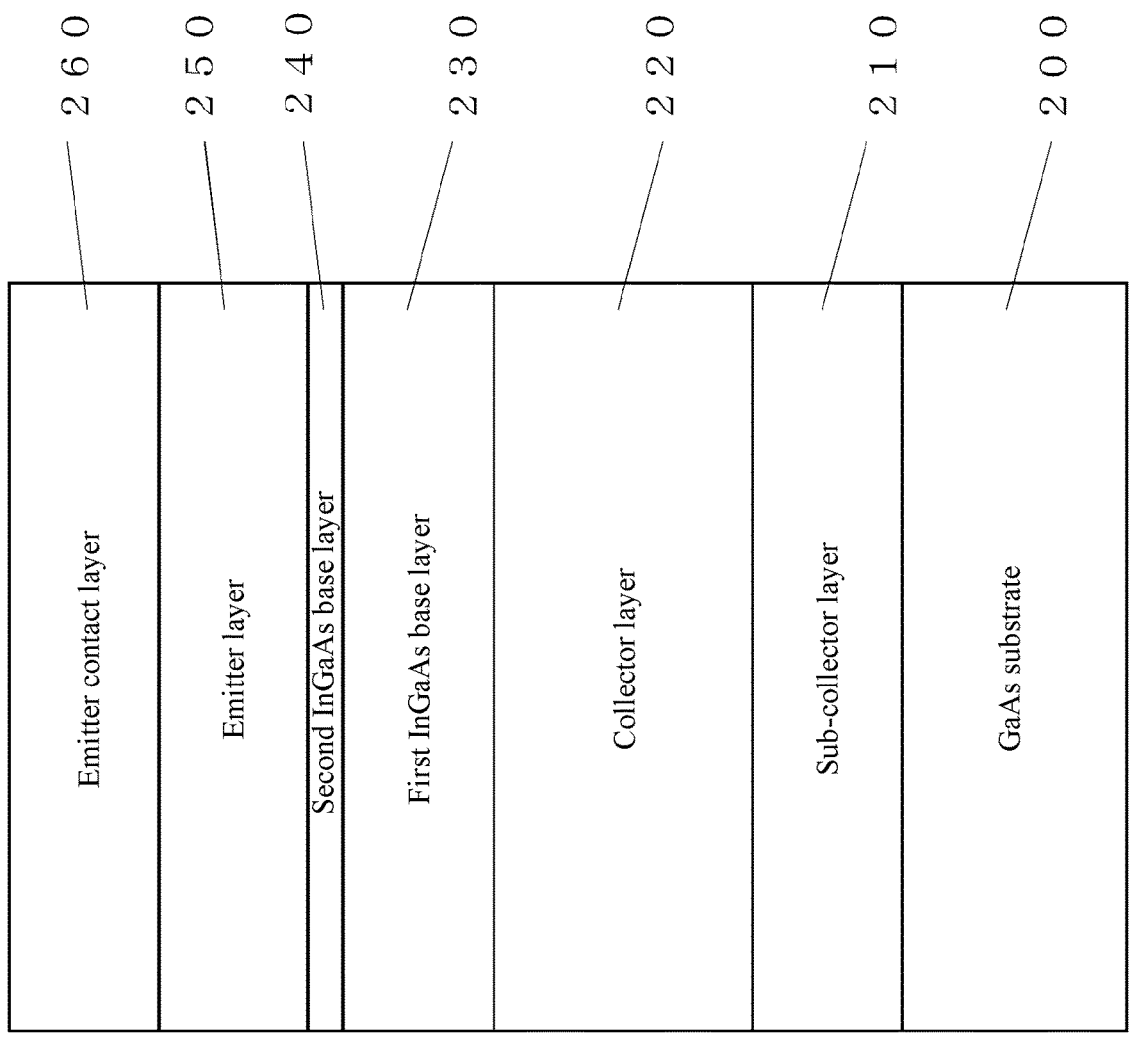
FIG. 17 illustrates a semiconductor layer structure of main constituting elements of a GaAs HBT according to the second invention of the application.

FIG. 17 illustrates a semiconductor layer structure of main constituting elements of a GaAs HBT according to the second invention of the application. On a GaAs substrate 200, a sub-collector layer 210, a collector layer 220, a first InGaAs base layer 230, a second InGaAs base layer 240, an emitter layer 250, and an emitter contact layer 260 are formed by epitaxial growth. A plane orientation of the GaAs substrate 200 is (100). The sub-collector layer 210, the collector layer 220, the emitter layer 250 and the emitter contact layer 260 are n-type semiconductors, and the first InGaAs base layer 230 and the second InGaAs base layer 240 are p-type semiconductors. The sub-collector layer 210, the collector layer 220, the first InGaAs base layer 230, the second InGaAs base layer 240 and the emitter layer 250 constitute an essential part of an non-type transistor, and the layers all use semiconductor free of relaxation of the strain caused by a lattice mismatch to GaAs. For the sub-collector layer 210 and the collector layer 220, for example, the material same as the substrate, GaAs, is used. Alternatively, other semiconductors with a negligible lattice mismatch to GaAs, such as InGaP, AlGaAs, or a stacked structure of the semiconductors, may also be used. The first InGaAs base layer 230 and the second InGaAs base layer 240 are grown by pseudomorphic growth without strain relaxation while maintaining a compressive strain. When the p-type impurity concentrations in the first InGaAs base layer 230 and the second InGaAs base layer 240 are Np1 and Np2, respectively, these concentrations satisfy the relation Np2<Np1.

In an exemplary form of the second invention of the application, Np2 is less than or equal to 0.5×Np1.

In an exemplary form of the second invention of the application, Np1 is more than or equal to $2 \times 10^{19}$ cm$^{-3}$.

In an exemplary form of the second invention of the application, the thickness of the second InGaAs base layer 240 is set to be in a range of 1 nm to 6 nm.

In an exemplary form of the second invention of the application, for both the first InGaAs base layer 230 and the second InGaAs base layer 240, the average value of the In content j is in a range of 0.05 to 0.12 where the composition of InGaAs is described as $In_jGa_{1-j}As$.

Figure 18:
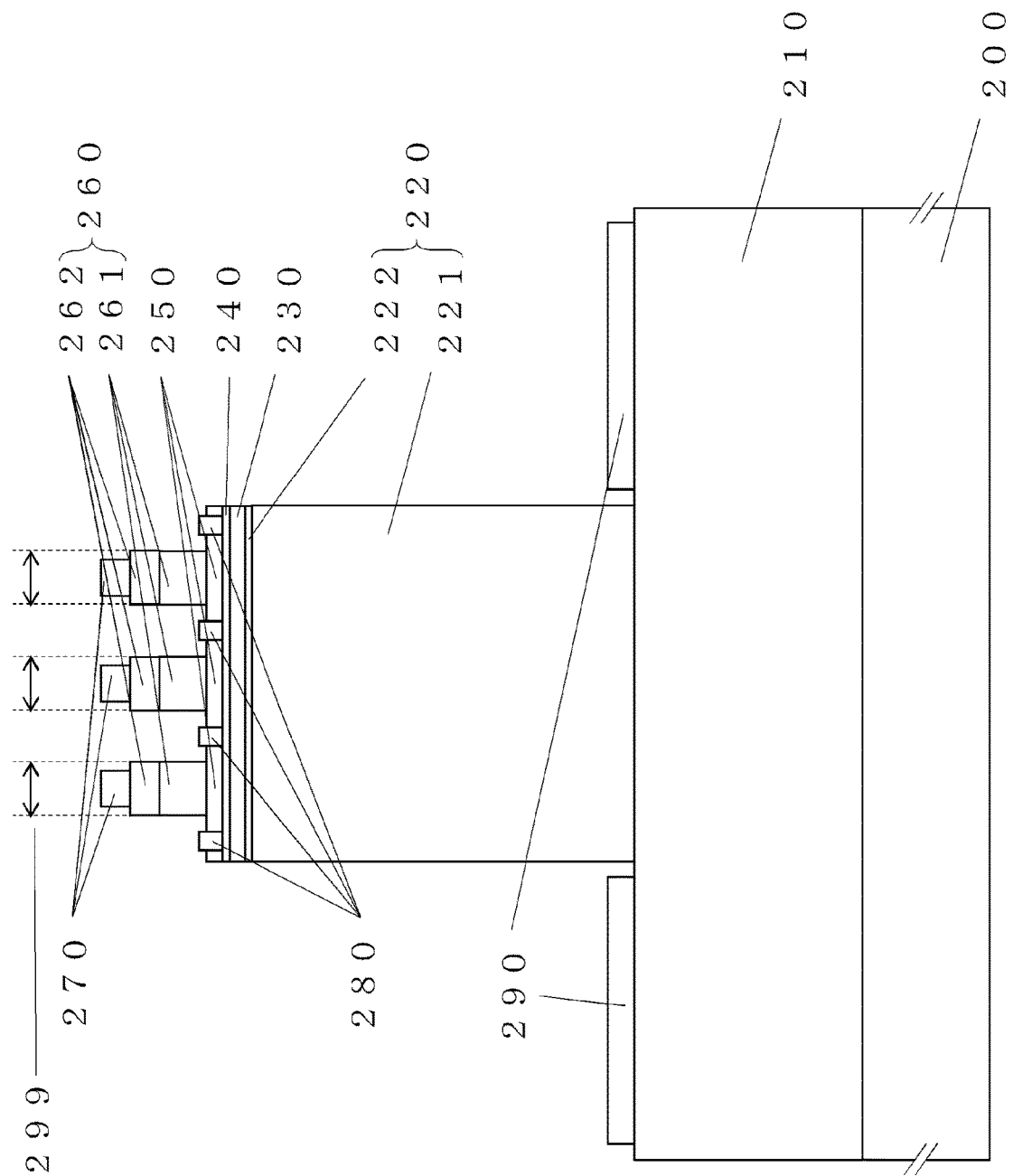
FIG. 18 illustrates a sectional structure of one embodiment of the GaAs HBT according to the second invention of the application with the main constituting elements shown in FIG. 17.

A sectional structure of the GaAs HBT shown in FIG. 18 is a typical example when the GaAs HBT having the main constituent elements shown in FIG. 17 is used as a power amplifier. In the present embodiment, the emitter is divided into three regions, and the width of each emitter shown by an arrow 299 in FIG. 18 is 3 microns. In addition, the size (length) of the emitter in the direction orthogonal to the paper surface is 40 microns. Therefore, the area of the emitter is 360 square microns. In the GaAs HBT shown in FIG. 18, an emitting electrode 270 is disposed on the emitter contact layer 260; a base electrode 280 is disposed on the second InGaAs base layer 240; and a collector electrode 290 is disposed on the sub-collector layer 210. Electrical connection to each region of the transistor is made through these electrodes. In addition, in FIG. 18, the collector layer 220 and the emitter contact layer 260 both include a stacked two-layer structure. Table 2 shows a conductivity type, a type and concentration of impurity, and a thickness of each semiconductor layer including the stacked structures. A first collector layer 221 consists of GaAs. A second collector layer 222 has a composition gradient in such a way that the composition of the semiconductor becomes GaAs on a first collector layer 221 side and becomes InGaAs on a first InGaAs base layer 230 side. That is, In content k when the composition is described as $In_kGa_{1-k}As$ continuously changes from approximately 0 on the first collector layer side to approximately 0.1 on the first InGaAs base layer 230 side. The reason for this is that the conduction band energy is smoothly connected from the first collector layer 221 to the first InGaAs base layer 230. The p-type impurity of the first InGaAs base layer 230 and the second InGaAs base layer 240 is carbon (C), and has concentrations of Np1 and Np2, respectively. Here, Np2 is less than Np1. Its effect will be described later. The entire thickness of the InGaAs base layer is 35 nm, and the thickness of the second InGaAs base layer 240 is X. X is more than 0 nm and less than 35 nm, but as described later, when X is more than or equal to 1 nm and less than or equal to 6 nm, a particularly obvious characteristics improvement can be obtained. The In content of the first InGaAs base layer 230 and the second InGaAs base layer 240, that is, In content j when the composition is described as $In_jGa_{1-j}As$, is 0.1. As described in the paragraph explaining the prior art, the entire thickness (which is 35 nm in the present embodiment) of the InGaAs base layer is chosen according to the In content. The emitter layer 250 uses the conventional InGaP having Eg equal to 1.89 eV at room temperature. In content i when the composition is described as $In_iGa_{1-i}P$ is 0.48. In the present embodiment, all the semiconductor layers on the GaAs substrate 200 except the uppermost InGaAs emitter contact layer 262 are grown without substantial relaxation of strain caused by the lattice mismatch to GaAs. With the absence of lattice defects caused by the strain relaxation, a device having excellent characteristics can be obtained. On the other hand, the In content is made sufficiently large in the InGaAs emitter contact layer 262 for the emitter electrode 270 shown in FIG. 18 to form a good ohmic contact. The lattice defects are generated by the strain relaxation occurring in the InGaAs emitter contact layer 262, but by setting the thickness of the lower GaAs emitter contact layer 261 to 120 nm, the lattice defects are prevented from affecting the essential part of the device and degrading the characteristics.

TABLE 2

| Code number | Type | Conductivity type | Type of impurity | Concentration of Impurity (cm$^{-3}$) | Thickness (nm) |
|---|---|---|---|---|---|
| 262 | InGaAs emitter contact layer | n-type | Si | >5 × 10$^{18}$ | 80 |
| 261 | GaAs emitter contact layer | n-type | Si | 5 × 10$^{18}$ | 120 |
| 250 | Emitter layer (In$_j$Ga$_{1-j}$P, j = 0.48) | n-type | Si | 3 × 10$^{17}$ | 40 |
| 240 | Second InGaAs base layer (In$_j$Ga$_{1-j}$As, j = 0.1) | p-type | C | Np2 | X |
| 230 | First InGaAs base layer (In$_j$Ga$_{1-j}$As, j = 0.1) | p-type | C | Np1 | 35-X |
| 222 | Second collector layer (In$_k$Ga$_{1-k}$As, k = 0 – 0.1) | n-type | Si | 1 × 10$^{15}$ | 10 |
| 221 | First collector layer (GaAs) | n-type | Si | 1 × 10$^{15}$-1 × 10$^{17}$ | 1000 |
| 210 | Sub-collector layer (GaAs) | n-type | Si | 5 × 10$^{18}$ | 600 |
| 200 | GaAs substrate | Semi-insulating | — | — | |

Figure 19:
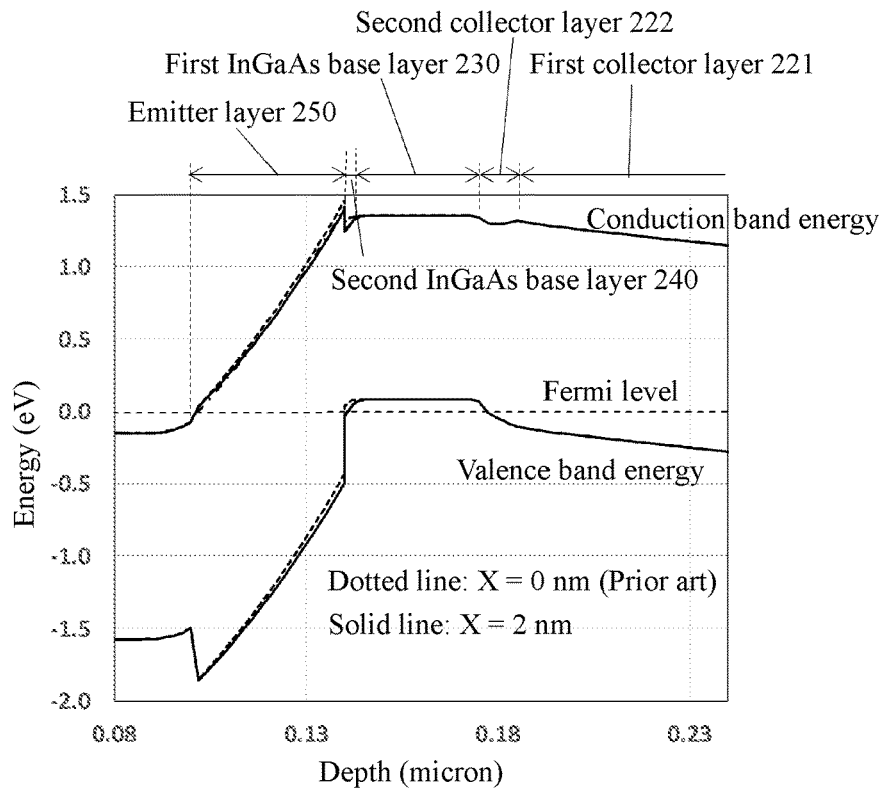
FIG. 19 is a diagram illustrating a depth dependence of conduction band energy, valence band energy and Fermi level of the GaAs HBT according to the second invention of the application shown in FIG. 18.
Figure 20:
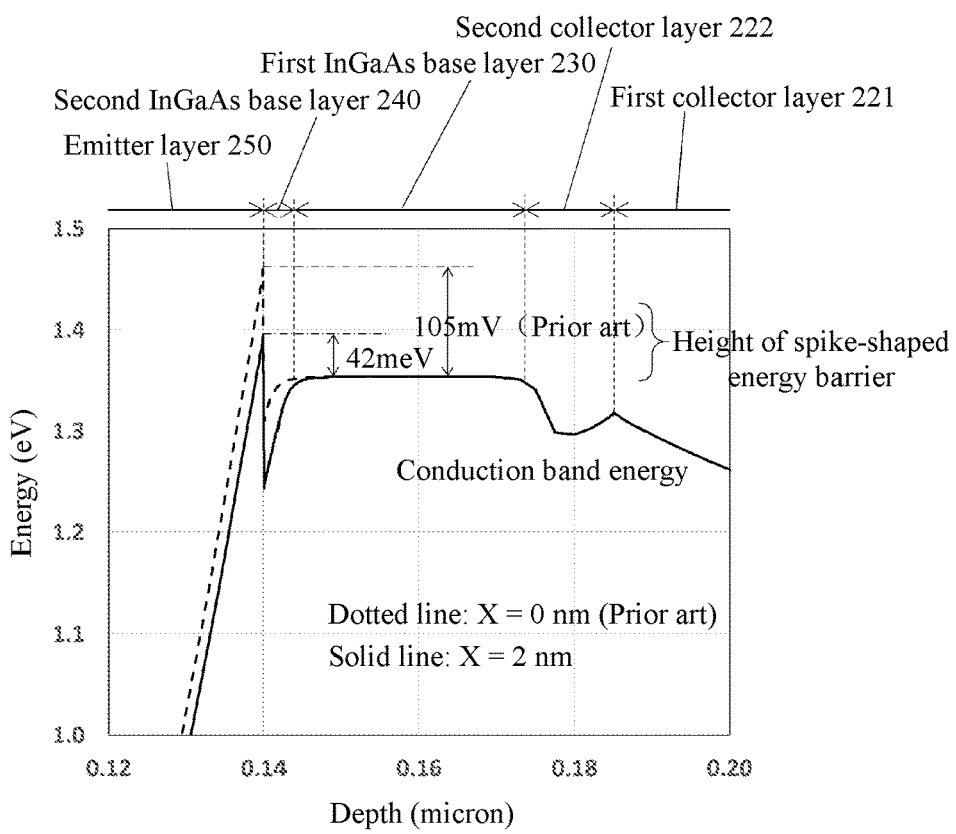
FIG. 20 is a diagram illustrating a depth dependence of conduction band energy of the GaAs HBT according to the second invention of the application shown in FIG. 18.
Figure 36A:
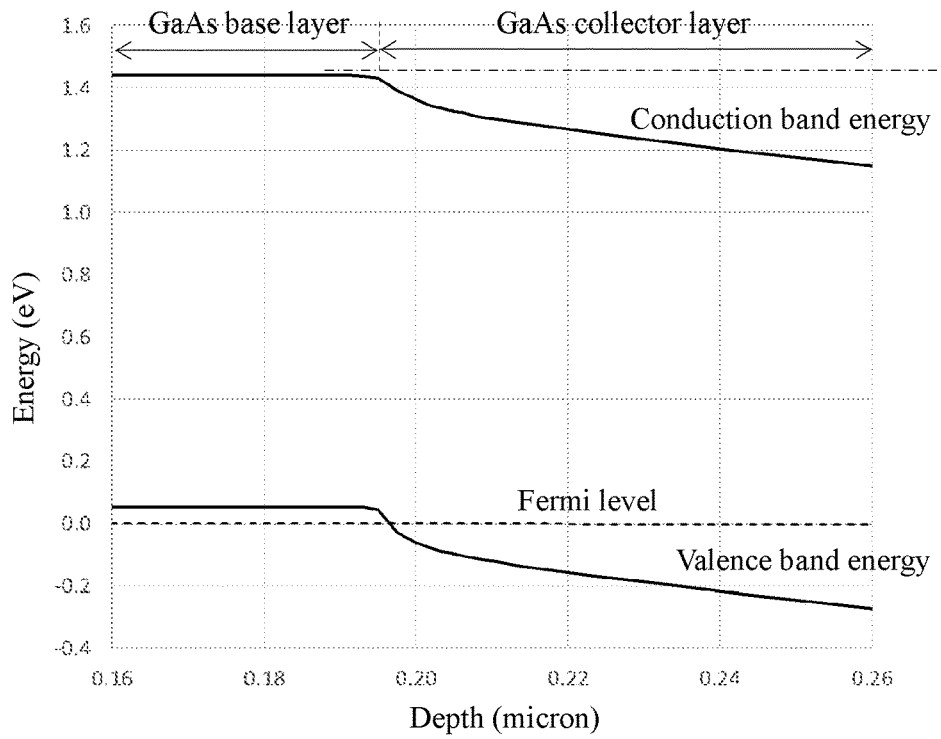
FIG. 36a is a diagram illustrating a depth dependence of conduction band energy, valence band energy and Fermi level for a conventional GaAs HBT using GaAs for a base layer.
Figure 36B:
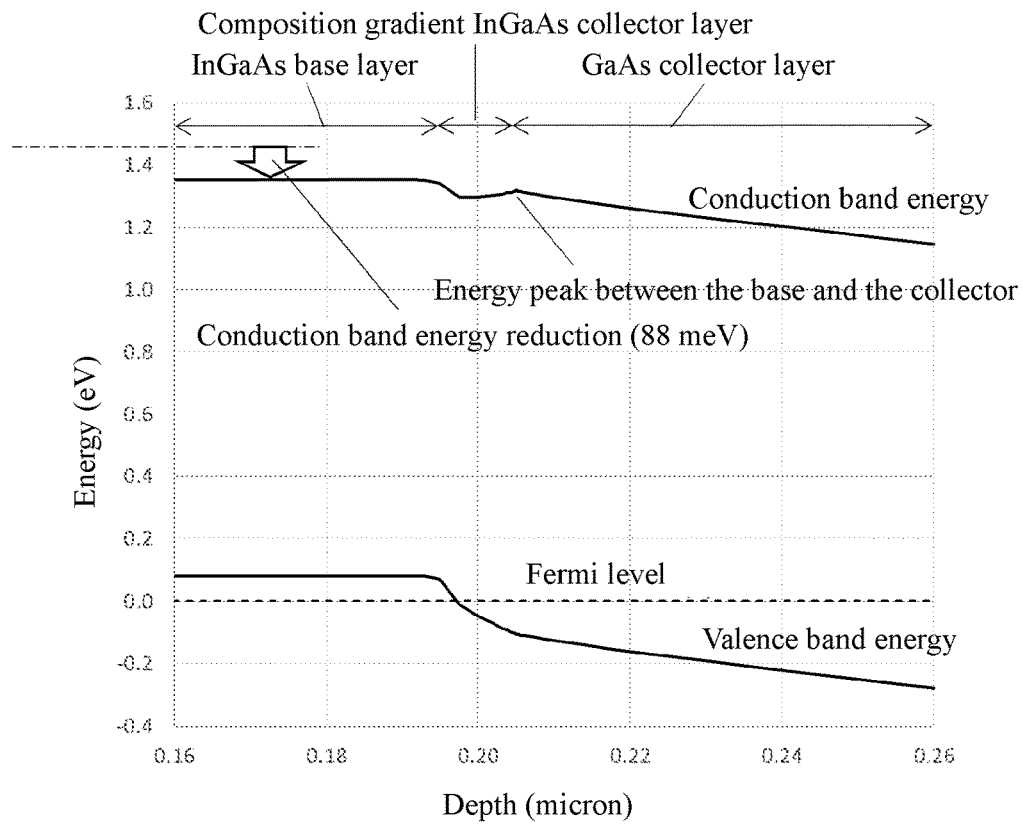
FIG. 36b is a diagram illustrating a depth dependence of conduction band energy, valence band energy and Fermi level for a conventional GaAs HBT using InGaAs for a base layer.

Hereinafter, effects of the second invention of the application will be described. First, the structure of the band energy calculated by two-dimensional device simulation of the GaAs HBT shown in FIG. 18 and Table 2 is described. FIG. 19 illustrates a depth dependence of conduction band energy, valence band energy, Fermi level from the emitter layer 250, through the second InGaAs base layer 240, the first InGaAs base layer 230, and the second collector layer 222, to the first collector layer 221. FIG. 20 is an enlarged view showing the depth dependence of the conduction band energy for the junction portion. No voltage is applied to the transistor, so Fermi level is constant in depth as shown in FIG. 19. In FIG. 19 and FIG. 20, a dotted line and a solid line are drawn in the emitter layer 250 and the second InGaAs base layer 240 regions. The dotted line shows the case where X=0 nm and no second InGaAs base layer 240 exists, that is, the dotted line shows the case of the conventional GaAs HBT. On the other hand, the solid line shows the case for the GaAs HBT of the invention, and the thickness X of the second InGaAs base layer 240 is 2 nm. The p-type impurity concentration Np1 of the first InGaAs base layer 230 is 4×10$^{19}$ cm$^{-3}$, and the p-type impurity concentration Np2 of the second InGaAs base layer 240 is 1×10$^{19}$ cm$^{-3}$. Regarding the conduction band energy shown in FIG. 20, the height of the spike-shaped energy barrier is 105 meV for the conventional GaAs HBT as also shown in FIG. 4 as a prior art. Relative to this, in the case of the GaAs HBT of the invention shown by the solid line, the height of the spike-shaped energy barrier is 42 meV, which is 63 meV lower than the case of the conventional GaAs HBT. The reason is explained below. The p-type impurity concentration of the first InGaAs base layer is as high as 4×10$^{19}$ cm$^{-3}$. Generally, if an impurity concentration in a semiconductor becomes high, the concentration of conduction carriers becomes high, and Fermi level enters the band making the semiconductor so-called a degenerate semiconductor. InGaAs has a lower valence band density of states than GaAs, so a p-type semiconductor more easily becomes the degenerate type. For the same p-type impurity concentration, Fermi level enters the valence band deeper for InGaAs than for GaAs. For example, in the prior art shown in FIG. 36a and FIG. 36b, the concentration of carbon serving as ap-type impurity is 4×10$^{19}$ cm$^{-3}$, but Fermi level in the InGaAs base shown in FIG. 36b enters the valence band more deeply than that in the GaAs base shown in FIG. 36a. The second invention of the application makes use of this feature in the p-type InGaAs base. The valence band energy measured with respect to Fermi level varies depending on the concentration of the p-type impurity (which is carbon in the present example). In the embodiments shown in FIG. 19 and FIG. 20, the carbon concentration of the second InGaAs base layer 240 is 1×10$^{19}$ cm$^{-3}$, which is a quarter of the carbon concentration of the first InGaAs base layer. Therefore, as seen in FIG. 19, the valence band energy with respect to Fermi level is lowered in the second InGaAs base layer 240. Therefore, the whole energy band including the conduction band is pulled down, and as a result, the spike-shaped energy barrier generated near the interface between the emitter layer 250 and the base layer is also pulled down. This feature becomes particularly significant when the p-type impurity concentration of the first InGaAs base layer is 2×10$^{19}$ cm$^{-3}$ or above.

Figure 21:
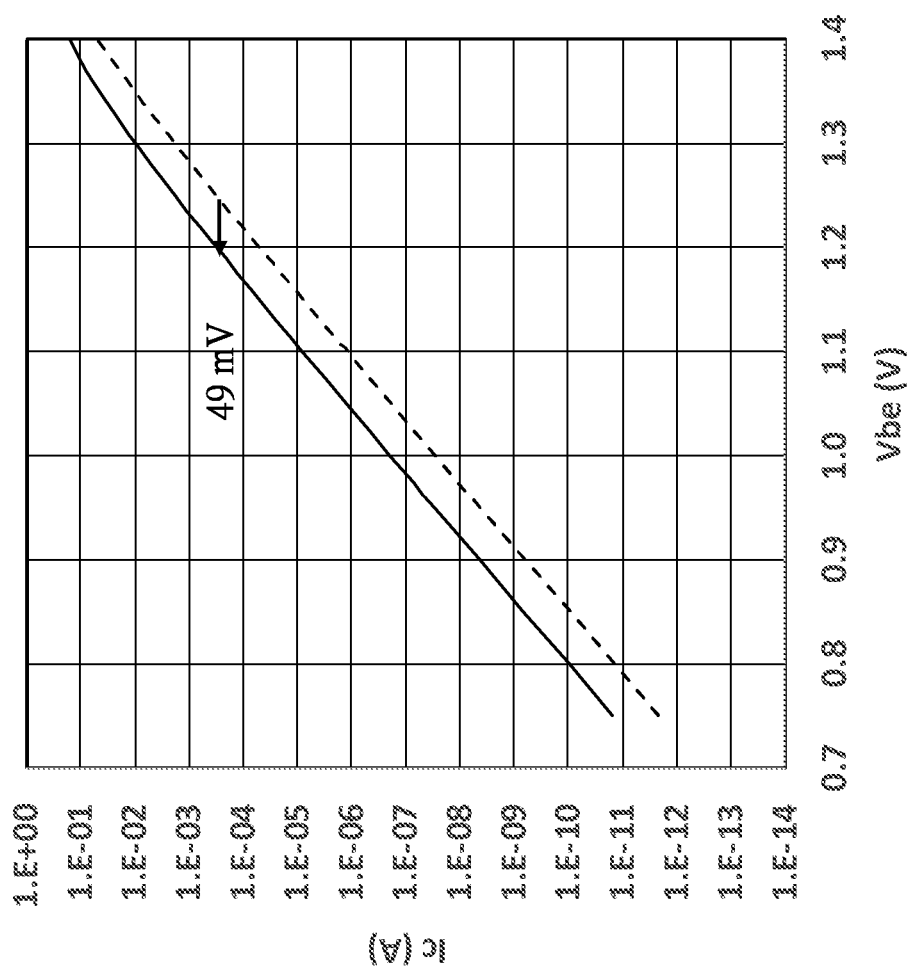
FIG. 21 is a diagram illustrating a Vbe dependence of collector current Ic when the same positive voltage Vbe is applied to the base and the collector in the GaAs HBT according to the second invention of the application shown in FIG. 18.
Figure 22:
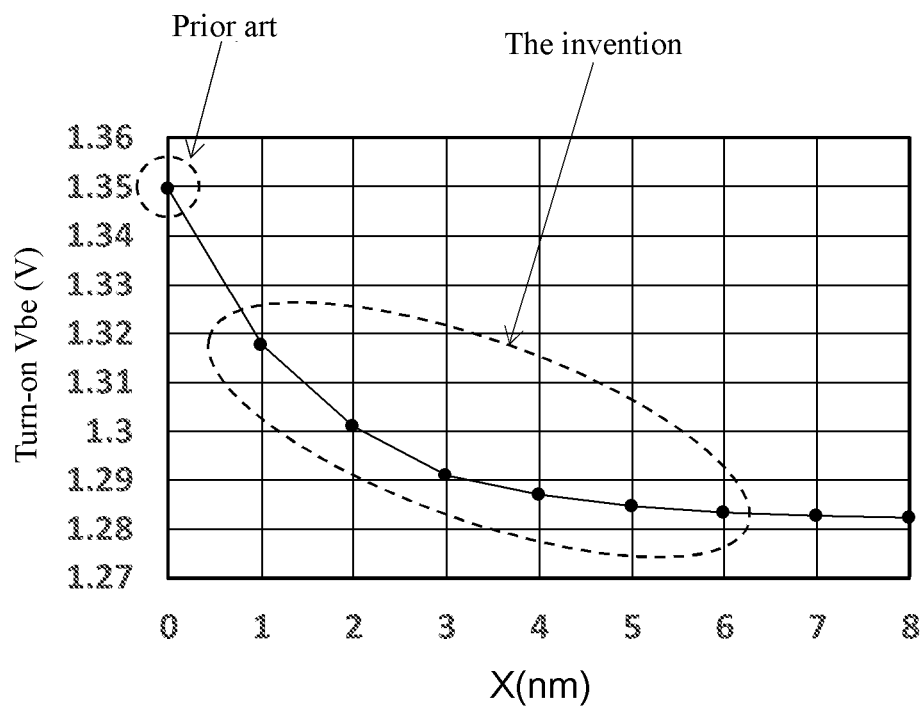
FIG. 22 is a diagram illustrating a relation between a turn-on Vbe and a thickness X of the second InGaAs base layer 240 for the GaAs HBT according to the second invention of the application shown in FIG. 18.
Figure 23:
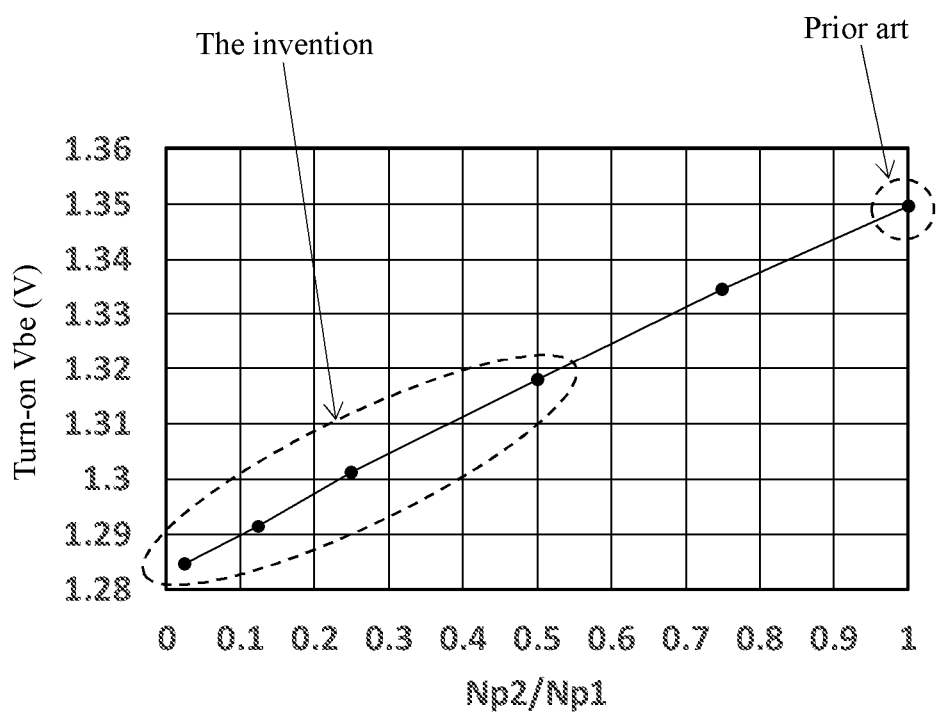
FIG. 23 is a diagram illustrating a relation between a turn-on Vbe and a p-type impurity concentration ratio Np2/Np1 of the second InGaAs base layer 240 and the first InGaAs base layer 230 for the GaAs HBT according to the second invention of the application shown in FIG. 18.

Next, direct-current characteristics (DC characteristics) of the GaAs HBT shown in FIG. 18 and Table 2 calculated through two-dimensional device simulation are described. FIG. 21 illustrates the Vbe dependence of collector current Ic when the emitter electrode 270 in the GaAs HBT shown in FIG. 18 is grounded and the same positive voltage Vbe is applied to the base electrode 280 and the collector electrode 290, which are the Ic characteristic obtained through the measurement of so-called Gummel plot. As in FIG. 19 and FIG. 20, the dotted line indicates the case where X=0 nm and no second InGaAs base layer 240 exists, that is, the dotted line indicates the case of the conventional GaAs HBT. On the other hand, the solid line indicates the case of GaAs HBT of the invention. In the present embodiment, the thickness X of the second InGaAs base layer 240 is 2 nm, and the p-type impurity concentration Np2 is 1×10$^{19}$ cm$^{-3}$. The impurity concentration Np1 of the first InGaAs base region layer 230 is 4×10$^{19}$ cm$^{-3}$. The Vbe where Ic reaches a certain determined value is turn-on Vbe. The two Ic curves shown in FIG. 21 show a horizontal shift of 49 mV. This means that the magnitude of shift is independent of Ic that defines the turn-on Vbe. The turn-on Vbe of the invention is 49 mV less than the turn-on Vbe of the conventional case. This change is caused by the 63 meV reduction of the height of the spike-shaped energy barrier in the case of the invention shown in FIG. 20. FIG. 22 is a diagram illustrating a relation between the turn-on Vbe and X. Np1 is $4\times10^{19}$ cm$^{-3}$, and Np2 is $1\times10^{19}$ cm$^{-3}$. As X increases, that is, as the thickness of the second InGaAs base layer 240 increases, the turn-on Vbe decreases. In FIG. 22, the data points with X in a range of 1 nm to 6 nm are labeled "the invention". The reason for this is that a particularly significant characteristics improvement can be obtained when X is more than or equal to 1 nm and less than or equal to 6 nm. The specific explanation will be given in the description of FIG. 27. FIG. 23 is a diagram illustrating a relation between the turn-on Vbe and the Np2/Np1 ratio. This figure shows the case where Np1 is fixed at $4\times10^{19}$ cm$^{-3}$. Therefore, Np2/Np1=0.25 is equivalent to Np2=$1\times10^{19}$ cm$^{-3}$. X is 2 nm. Np2/Np1=1 is equivalent to the case where no second InGaAs base layer 240 exists, that is, the case of the conventional GaAs HBT. Th turn-on Vbe decreases as Np2/Np1 decreases. In FIG. 23, the data points for Np2/Np1 less than or equal to 0.5 are labeled "the invention". The reason for this is that a particularly significant characteristics improvement can be obtained when Np2/Np1 is less than or equal to 0.5. The specific explanation will be given in the description of FIG. 31.

Figure 24:
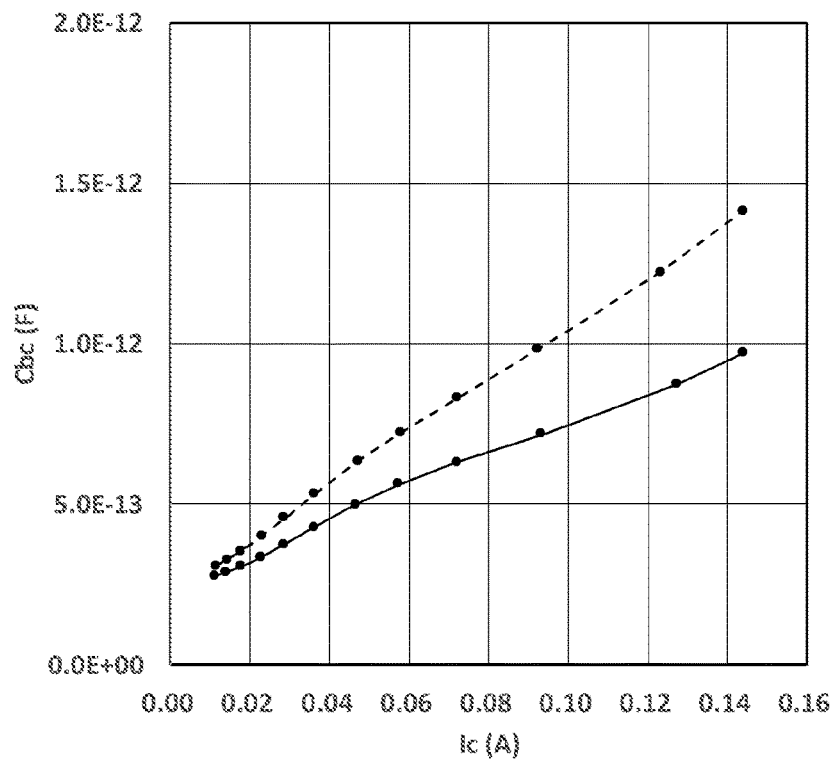
FIG. 24 is a diagram illustrating a collector current Ic dependence of base-collector capacitance Cbc for the GaAs HBT according to the second invention of the application shown in FIG. 18.
Figure 25:
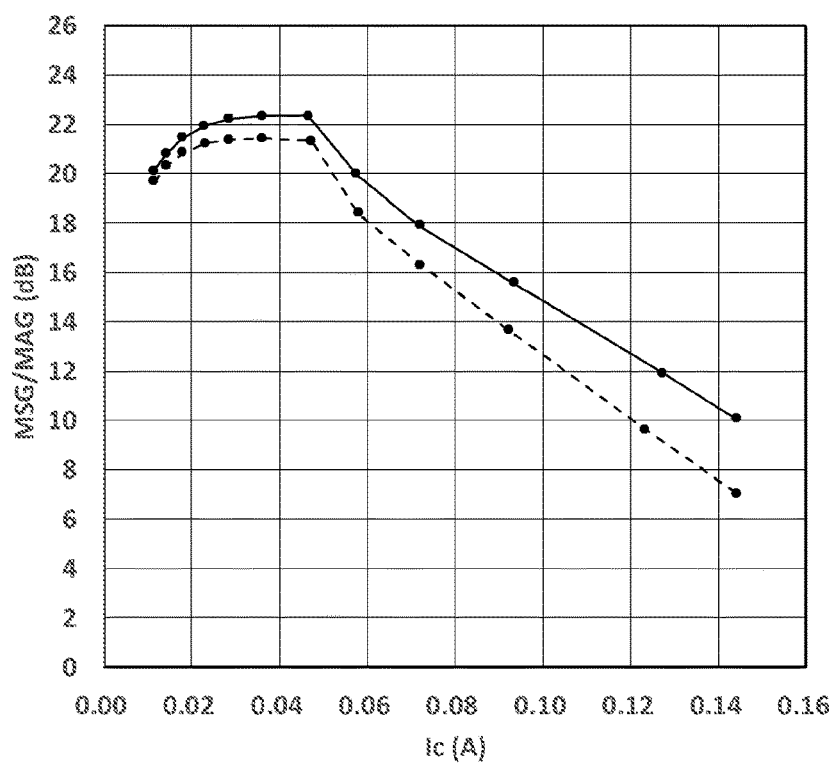
FIG. 25 is a diagram illustrating a collector current Ic dependence of power gain MSG/MAG for the GaAs HBT according to the second invention of the application shown in FIG. 18.
Figure 26:
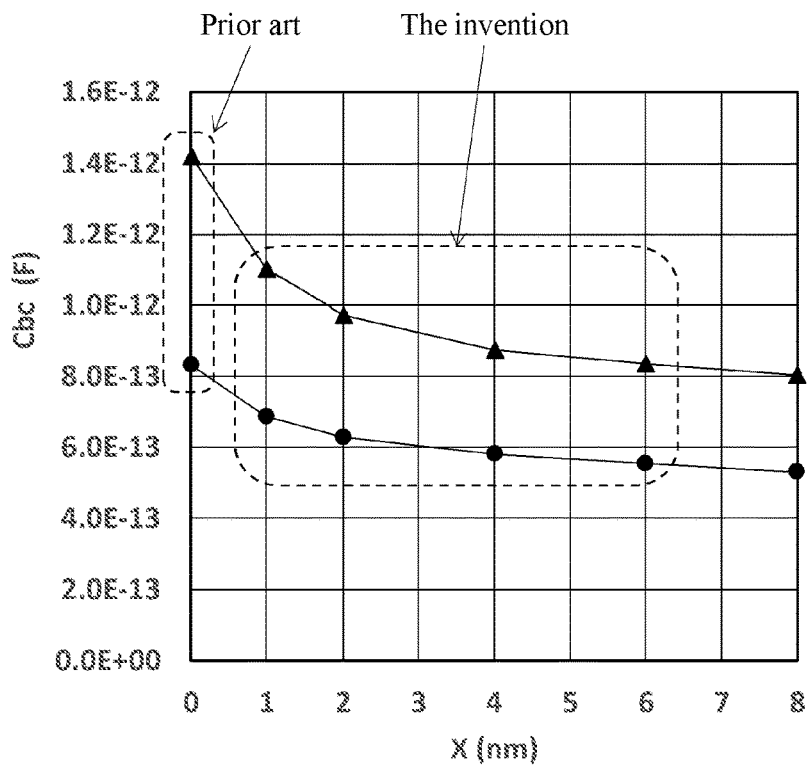
FIG. 26 is a diagram illustrating a relation between a base-collector capacitance Cbc and a thickness X of the second InGaAs base layer 240 for the GaAs HBT according to the second invention of the application shown in FIG. 18.
Figure 27:
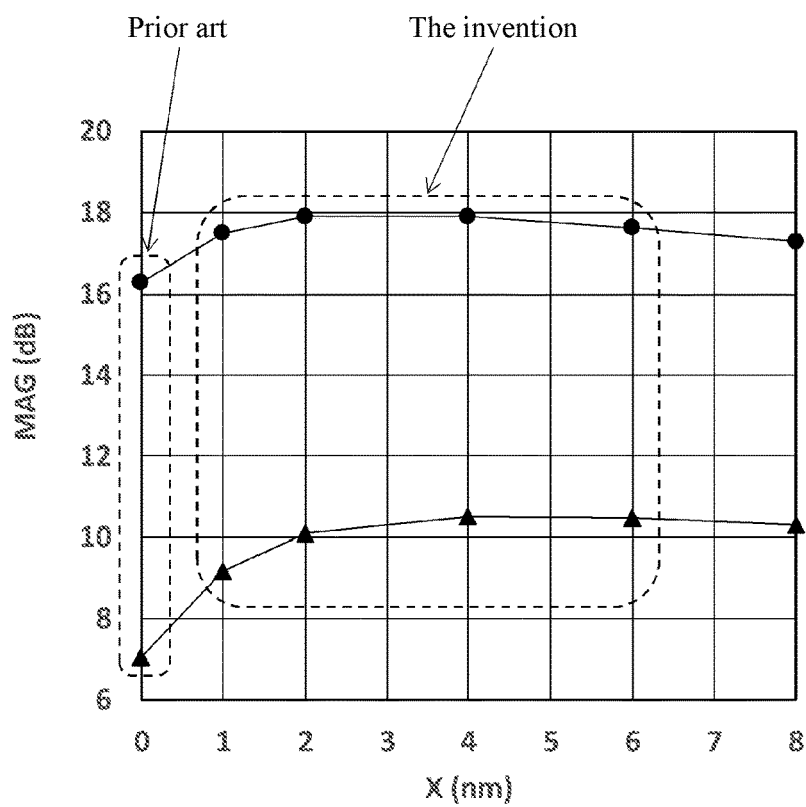
FIG. 27 is a diagram illustrating a relation between a power gain MAG and a thickness X of the second InGaAs base layer 240 for the GaAs HBT according to the second invention of the application shown in FIG. 18.
Figure 28:
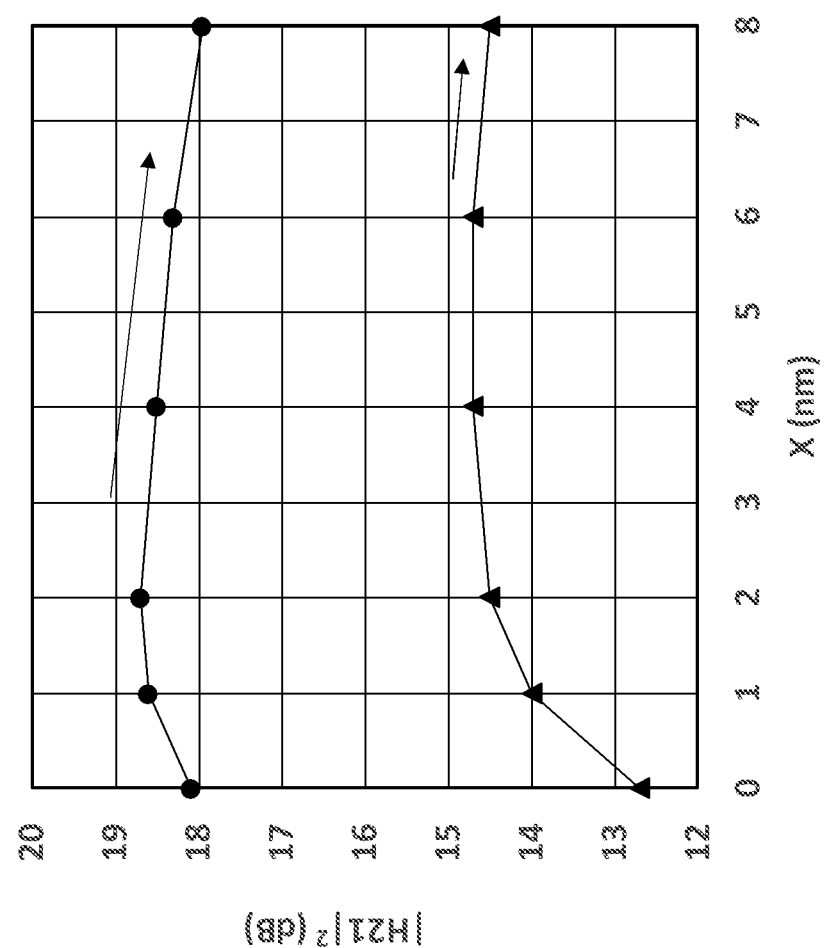
FIG. 28 is a diagram illustrating a relation between $|H21|^2$ and a thickness X of the second InGaAs base layer 240 for the GaAs HBT according to the second invention of the application shown in FIG. 18.
Figure 29:
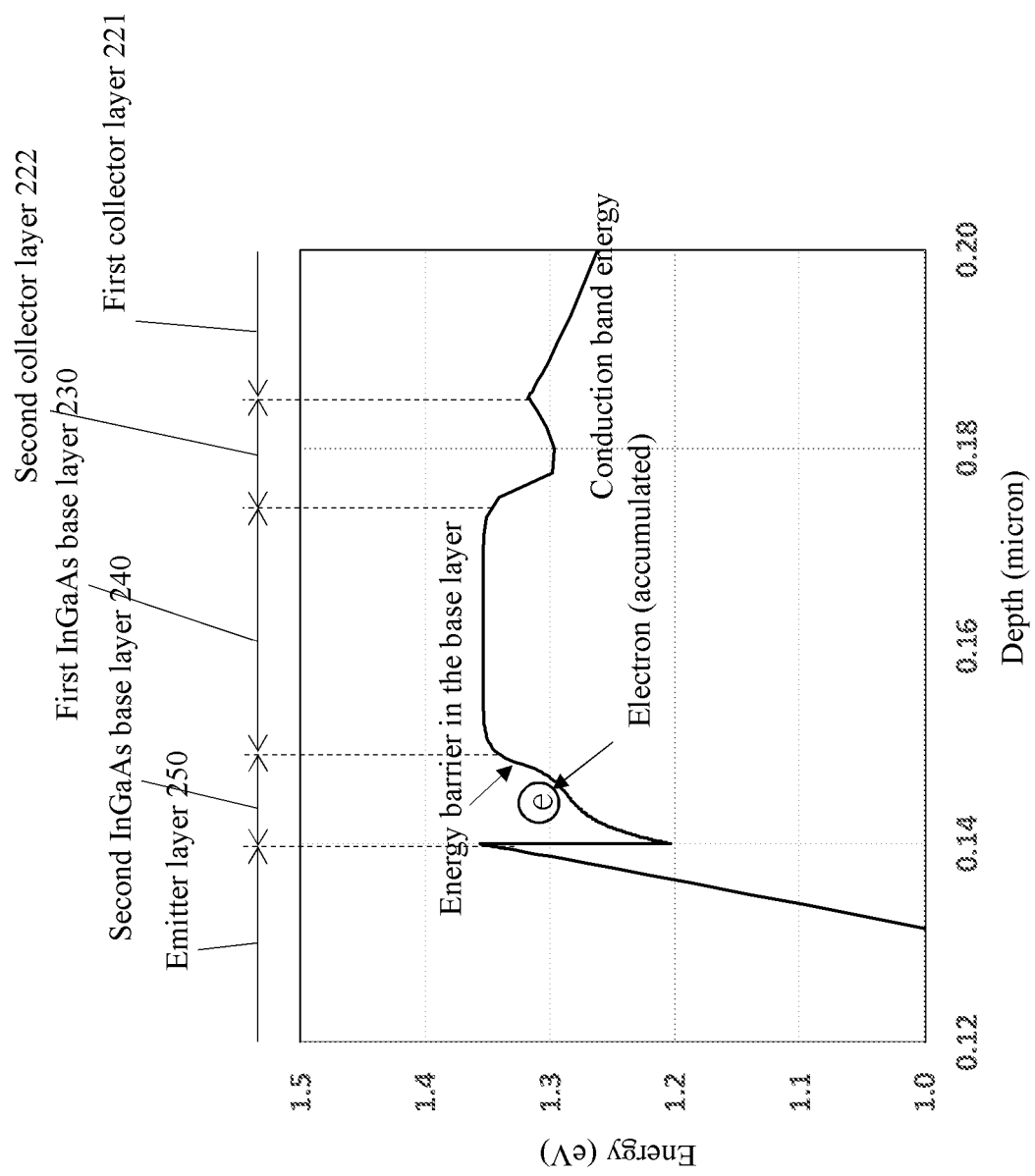
FIG. 29 is a diagram illustrating a depth dependence of conduction band energy of another embodiment, different from FIG. 20, for the GaAs HBT according to the second invention of the application shown in FIG. 18.
Figure 30:
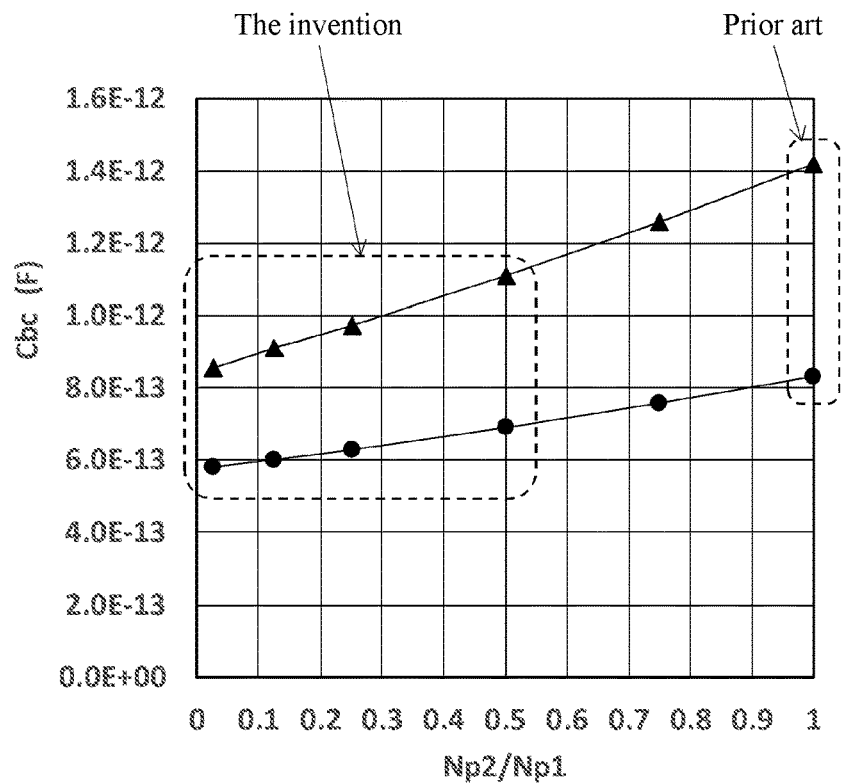
FIG. 30 is a diagram illustrating a relation between a base-collector capacitance Cbc and a ratio of p-type impurity concentration Np2/Np1 for the second InGaAs base layer 240 and the first InGaAs base layer 230 for the GaAs HBT according to the second invention of the application shown in FIG. 18.
Figure 31:
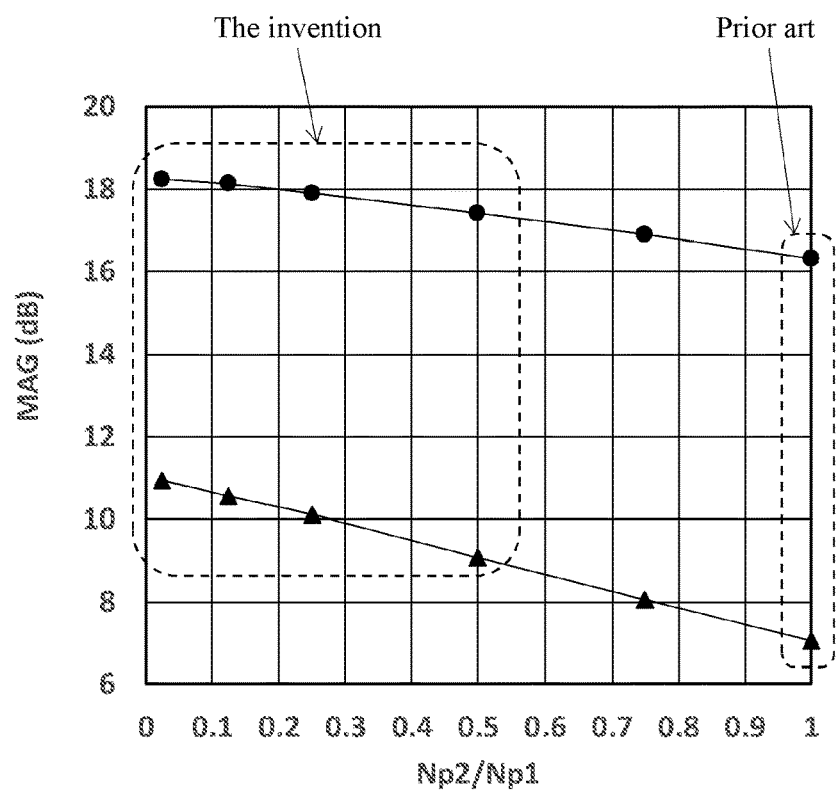
FIG. 31 is a diagram illustrating a relation between a power gain MAG and a ratio of p-type impurity concentration Np2/Np1 for the second InGaAs base layer 240 and the first InGaAs base layer 230 for the GaAs HBT according to the second invention of the application shown in FIG. 18.

Next, the high-frequency characteristics of the GaAs HBT shown in FIG. 18 and Table 2 calculated through two-dimensional device simulation are described. FIG. 24 is a diagram illustrating a collector current Ic dependence of base-collector capacitance Cbc. The voltage Vce between the collector and the emitter is fixed at 0.5 V, and the voltage Vbe between the base and the emitter is varied to obtain the Ic dependence. The definition of Cbc is the same as that described before. The dotted line indicates the case where X=0 nm and no second InGaAs base layer 240 exists, that is, the dotted line indicates the case of the conventional GaAs HBT. On the other hand, the solid line indicates the case of GaAs HBT of the invention. In the present embodiment, the thickness X of the second InGaAs base layer 240 is 2 nm, and the p-type impurity concentration Np2 is $1\times10^{19}$ cm$^{-3}$. The p-type impurity concentration Np1 of the first InGaAs base layer 230 is $4\times10^{19}$ cm$^{-3}$. Ic of the data points shown in FIG. 24 is 0.01 A or above. Therefore, all the data points enter the "low Vbe region" shown in FIG. 37. As is found from FIG. 21, Vbe for Ic equal to or above 0.01 A exceeds 1.25 V. Since Vce is 0.5 V, Vbc is equal to or larger than 0.75 V, which means that the pn junction between the base and the collector is in a high forward bias state. Therefore, in the case of the conventional GaAs HBT shown by the dotted line in FIG. 24, the forward bias is enhanced as Ic increases, and Cbc becomes high exceeding 1 pF. In the case of GaAs HBT of the present invention, Cbc is significantly reduced, and the reduction is more pronounced for the higher Ic. The reason for this is that the forward bias between the base and the collector becomes smaller due to the decrease in the turn-on Vbe. FIG. 25 illustrates an Ic dependence of maximum power gain at frequency f0=2 GHz. As in the case of Cbc in FIG. 24, the collector voltage Vce is 0.5 V. The vertical axis is labeled MSG/MAG, and its meaning is as described before. In FIG. 25, the slope of the curve changes suddenly at Ic equal to 0.05 A. The region below 0.05 A is the MSG region, and the region above 0.05 A is the MAG region. In FIG. 25, the solid line is for the GaAs HBT of the invention; the thickness X of the second InGaAs base layer 240 is 2 nm; the p-type impurity concentration Np2 is $1\times10^{19}$ cm$^{-3}$; and the p-type impurity concentration Np1 of the first InGaAs base layer 230 is $4\times10^{19}$ cm$^{-3}$. Compared with the case of the conventional GaAs HBT shown by the dotted line, MSG/MAG is high regardless of the current. This is because of the reduction of Cbc shown in FIG. 24. Cbc acts as a feedback capacitor in power amplification reducing the power gain. Especially in the "low Vce region", the pn junction between the base and the collector becomes highly forward biased and Cbc becomes very large, thus becoming a cause of reduction of the power gain. According to the invention, Cbc can be significantly reduced in the "low Vce region", and the reduction of power gain in this region can be suppressed. FIG. 26 is a diagram illustrating a relation between Cbc and X, and FIG. 27 is a diagram illustrating a relation between the maximum power gain and X, both showing the case where Np1 is $4\times10^{19}$ cm$^{-3}$ and Np2 is $1\times10^{19}$ cm$^{-3}$. Vce is 0.5 V. The black dots are data for Ic equal to 0.072 A, and the black triangles are data for Ic equal to 0.144 A. Ic=0.072 A and Ic=0.144 A both enter the "low Vce region" shown in FIG. 37. Since the area of the emitter is 360 square microns, Ic converted to an average current density in the emitter plane is 20 kA/cm$^2$ and 40 kA/cm$^2$, respectively. In FIG. 25, in either case of Ic=0.072 A or 0.144 A, since the maximum power gain enter the MAG region, the vertical axis of FIG. 27 is labeled MAG. In FIG. 26 and FIG. 27, the data point at X=0 labeled "prior art" is the case of the conventional GaAs HBT where the GaAs HBT does not include the second InGaAs base layer 240. For X larger than 0 nm, Cbc becomes lower and MAG becomes higher. In order for the effect of the invention to be appreciable, it is desirable to increase MAG by 1 dB or more for Ic=0.072 A (20 kA/cm$^2$), and 2 dB or more for Ic=0.144 A (40 kA/cm$^2$) from that of the conventional case. In FIG. 27, X between 1 nm and 6 nm meets this condition and therefore is labeled "the invention". In FIG. 22, FIG. 23, and FIG. 26, the range of X being more than or equal to 1 nm and less than or equal to 6 nm is also labeled "the invention". The X dependence of power gain (MAG) shown in FIG. 27 is explained in more detail below. MAG initially increases with increasing X, but starts to decrease at X over 6 nm. FIG. 28 is a diagram illustrating a relation between |H21|$^2$ and X under the same condition as that in FIG. 27. H21 is one of H parameters, and represents a current gain during RF operation. The black dots are data for Ic=0.072 A, and the black triangles are the data for Ic=0.144 A. Their values start to decrease at a large X. FIG. 29 illustrates the depth dependence of the conduction band energy when X=8 nm. Np1 is $4\times10^{19}$ cm$^{-3}$, and Np2 is $1\times10^{19}$ cm$^{-3}$. The conduction band energy shows a sharp rise at the interface between the second InGaAs base layer 240 and the first InGaAs base layer 230, which becomes an energy barrier for electrons in the second InGaAs base layer 240. Due to this energy barrier in the base layer, the electrons are accumulated in the second InGaAs base layer 240, and thus the current flow is blocked. This causes |H21|$^2$ to decrease, and even causes the power gain to drop. Therefore, if the thickness X of the second InGaAs base layer is too large, the characteristics improvement may not be obtained. For satisfying the above-mentioned MAG improvement conditions, X needs to be less than or equal to 6 nm in addition to X being more than or equal to 1 nm. Finally, Np2/Np1 dependence of the characteristics improvement is described. FIG. 30 and FIG. 31 are diagrams illustrating a relation between Cbc and Np2/Np1, and a relation between MAG and Np2/Np1, respectively. In both diagrams, X is 2 nm, Np1 is $4\times10^{19}$ cm$^{-3}$, and Vce is 0.5 V. The black dots are for Ic=0.072 A, and the black triangles are for Ic=0.144 A. Np2/Np1=1 is the case where the second InGaAs base layer 240 does not exist, and is equivalent to the case of conventional GaAs HBT. As Np2/Np1 becomes less than 1, Cbc monotonously decreases, and MAG monotonically increases. Again, the condition for the improvement by the invention to become significant, i.e. the condition that MAG becomes 1 dB or more larger for Ic=0.072 A (20 kA/cm$^2$) and 2 dB or more larger for Ic=0.144 A (40 kA/cm$^2$), is 0≤Np2/Np1≤0.5 as labeled "the invention" to the data in FIG. 31. The label to the data for the same condition is also shown in FIG. 30.

When the GaAs HBT of the second invention of the application is used for a power amplifier, an improvement of performance such as PAE characterizing power amplifiers can be obtained in the same way as that of the first invention of the application according to the degree of increase in the power gain in the "low Vce region". Particularly, the characteristics may be significantly improved in a power amplifier, such as the envelope tracking type amplifier, operated in the power saturation region.

Figure 32:
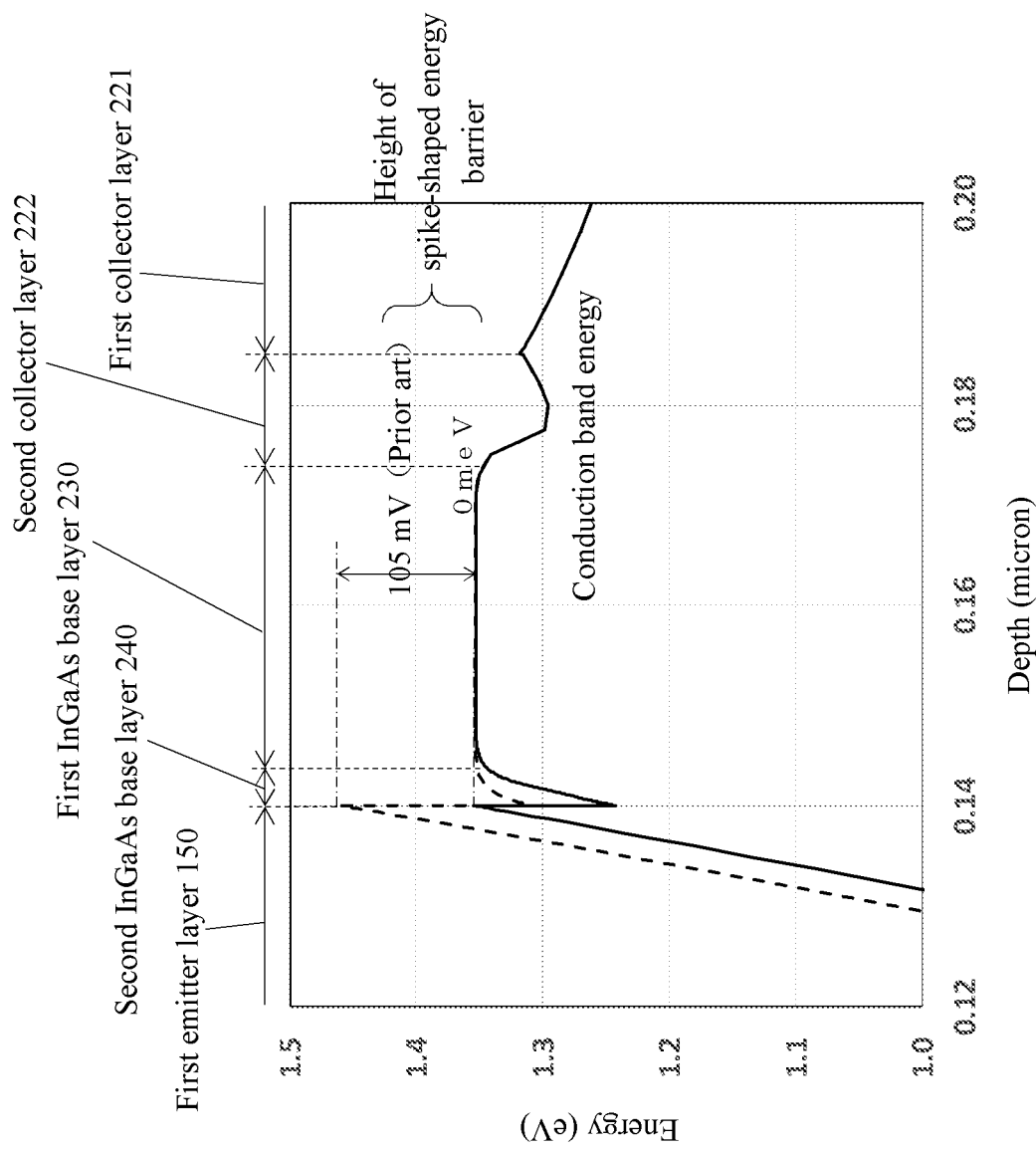
FIG. 32 is a diagram illustrating a depth dependence of conduction band energy of a GaAs HBT for an embodiment combining the first invention of the application and the second invention of the application.
Figure 33:
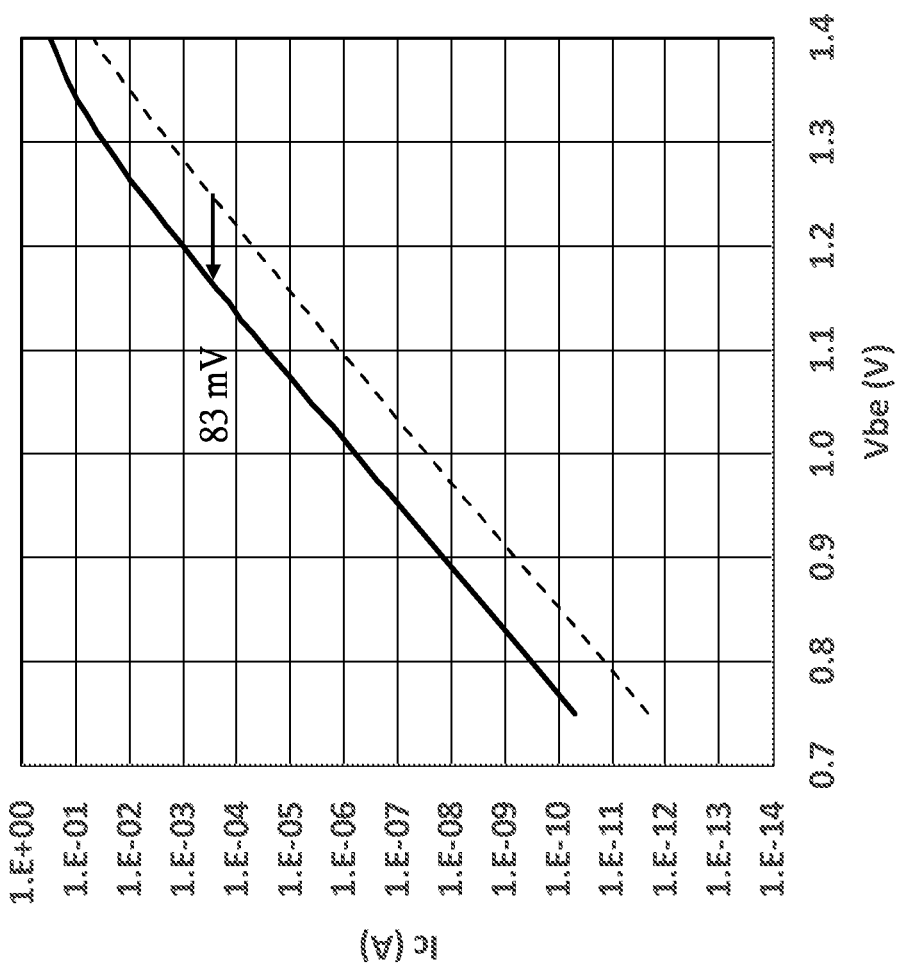
FIG. 33 is a diagram illustrating a Vbe dependence of collector current Ic when the same positive voltage Vbe is applied to the base and the collector in a GaAs HBT according to an embodiment combining the first invention of the application and the second invention of the application.
Figure 34:
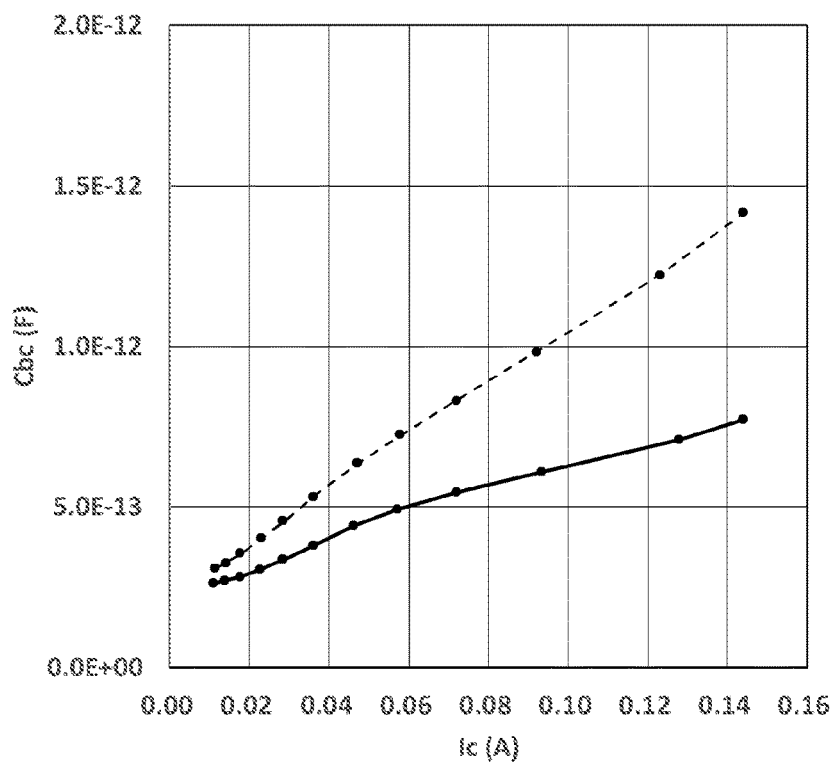
FIG. 34 is a diagram illustrating a collector current Ic dependence of base-collector capacitance Cbc for the GaAs HBT according to an embodiment combining the first invention of the application and the second invention of the application.
Figure 35:
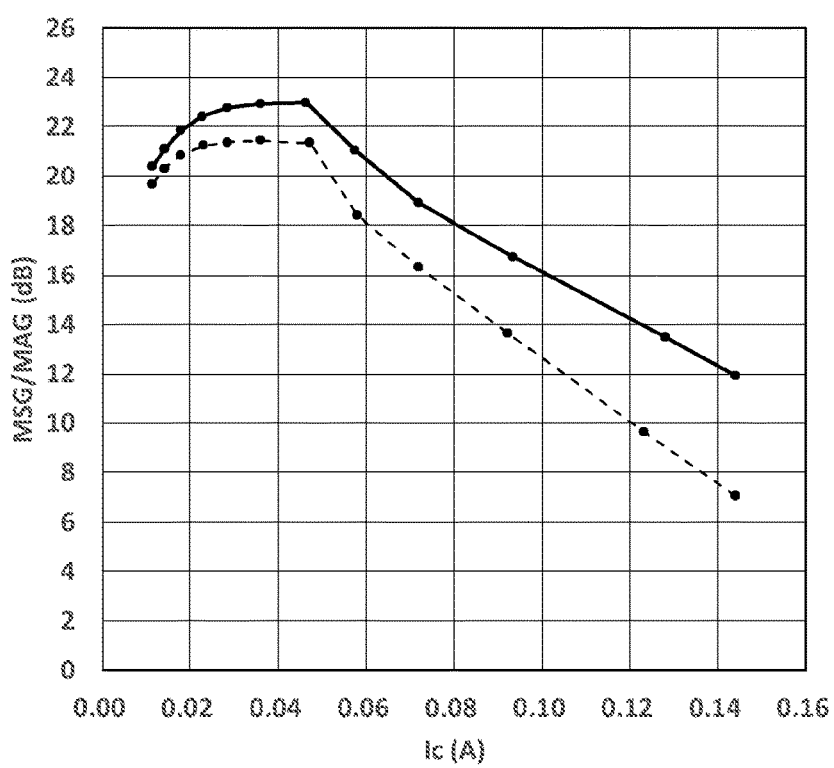
FIG. 35 is a diagram illustrating a collector current Ic dependence of power gain MSG/MAG for the GaAs HBT according to an embodiment combining the first invention of the application and the second invention of the application.

The second invention of the application may also be combined with the first invention of the application. FIG. 32 illustrates the depth dependence of the conduction band energy obtained through two-dimensional device simulation for the case in which the first emitter layer 250 shown in FIG. 18 and Table 2 for the second invention of the application is replaced with the first emitter layer 150 of the first invention of the application. The first emitter layer is InGaP having the CuPt-type ordering with Eg=1.85 eV. Np1 is equal to 4×10$^{19}$ cm$^{-3}$, Np2 is equal to 1×10$^{19}$ cm$^{-3}$, and X is equal to 2 nm. The dotted line indicates the case of the conventional GaAs HBT also shown in FIG. 4 and FIG. 20, and the height of the spike-shaped energy barrier is 105 meV. Relative to this, in the present embodiment combining the first invention of the application and the second invention of the application, as shown by the solid line, the height of the spike-shaped energy barrier becomes substantially zero. FIG. 33 shows a plot in a similar manner as that in FIG. 21. Compared with the case of the conventional GaAs HBT shown by the dotted line, Ic for the present embodiment shown by the solid line is largely shifted to the low voltage side, and the turn-on Vbe reduction of 83 mV is achieved. FIG. 34 and FIG. 35 illustrate Ic dependences of Cbc and the power gain (MSG/MAG), respectively. Vce is 0.5 V. The definitions of Cbc and MSG/MAG are the same as those described before. Compared with the case of the conventional GaAs HBT shown by the dotted line, in the present embodiment, a remarkable improvement is obtained for MSG/MAG as a result of the significant Cbc reduction.

When the GaAs HBT combining the first invention of the application and the second invention of the application is used in the power amplifier, an improvement of performance such as PAE characterizing power amplifiers can be obtained in the same way as that of the first invention of the application according to the degree of increase in the power gain in the "low Vce region". Particularly, the characteristics may be significantly improved in a power amplifier, such as the envelope tracking type amplifier, operated in the power saturation region.

INDUSTRIAL UTILIZABILITY

The GaAs HBTs of the first invention and the second invention of the application can be widely used as transistors for high-frequency amplifiers typified by power amplifiers for wireless communication.

What is claimed is:

1. A compound semiconductor heterojunction bipolar transistor, being an npn-type bipolar transistor comprising a collector layer, a base layer, and an emitter layer formed over a GaAs substrate in sequence, wherein the collector layer, the base layer, and the emitter layer each comprises a compound semiconductor layer epitaxially grown over the GaAs substrate and free of relaxation of strain caused by a lattice mismatch to GaAs;

the base layer at least comprises an InGaAs layer grown by pseudomorphic growth, and the emitter layer at least comprises a first InGaP layer with a CuPt-type ordering and a second InGaP layer disposed on a first side of the first InGaP layer opposite to the base layer, and the second InGaP layer has a CuPt-type ordering degree lower than that of the first InGaP layer or the second InGaP layer has substantially no CuPt-type ordering.

2. The compound semiconductor heterojunction bipolar transistor according to claim 1, wherein a band gap of the first InGaP layer is in a range of 1.76 eV to 1.86 eV at room temperature.

3. The compound semiconductor heterojunction bipolar transistor according to claim 2, wherein an In content i when composition of the first InGaP layer is described as $In_iGa_{1-i}P$ is in a range of 0.48 to 0.5.

4. The compound semiconductor heterojunction bipolar transistor according to claim 1, wherein an average value of an In content j when composition of the InGaAs layer is described as $In_jGa_{1-j}As$ is in a range of 0.05 to 0.12.

5. The compound semiconductor heterojunction bipolar transistor according to claim 1, wherein an n-type impurity concentration of a first portion of the first InGaP layer on the first side of the first InGaP layer is greater than an n-type impurity concentration of a second portion of the first InGaP layer on a second side of the first InGaP layer opposite to the first side.

6. A compound semiconductor heterojunction bipolar transistor, being an npn-type bipolar transistor comprising a collector layer, a base layer, and an emitter layer formed over a GaAs substrate in sequence, wherein the collector layer, the base layer, and the emitter layer each comprises a compound semiconductor layer epitaxially grown over the GaAs substrate and free of relaxation of strain caused by a lattice mismatch to GaAs;

the base layer at least comprises a first InGaAs layer grown by pseudomorphic growth, and a second InGaAs layer grown on the first InGaAs layer by pseudomorphic growth, and a p-type impurity concentration of the second InGaAs layer is less than a p-type impurity concentration of the first InGaAs layer.

7. The compound semiconductor heterojunction bipolar transistor according to claim 6, wherein the p-type impurity concentration of the second InGaAs layer is less than or equal to ½ of the p-type impurity concentration of the first InGaAs layer.

8. The compound semiconductor heterojunction bipolar transistor according to claim 7, wherein the p-type impurity concentration of the first InGaAs layer is 2×10$^{19}$ cm$^{-3}$ or above.

9. The compound semiconductor heterojunction bipolar transistor according to claim 6, wherein a thickness of the second InGaAs layer is in a range of 1 nm to 6 nm.

10. The compound semiconductor heterojunction bipolar transistor according to claim 6, wherein for the first InGaAs layer and the second InGaAs layer, an average value of an In content j when composition is described as $In_jGa_{1-j}As$ is in a range of 0.05 to 0.12.

11. The compound semiconductor heterojunction bipolar transistor according to claim 6, wherein the emitter layer at least comprises an InGaP layer.

12. A compound semiconductor heterojunction bipolar transistor, being an npn-type bipolar transistor comprising a collector layer, a base layer, and an emitter layer formed over a GaAs substrate in sequence, wherein the collector layer, the base layer, and the emitter layer each comprises a compound semiconductor layer epitaxially grown over the GaAs substrate and free of relaxation of strain caused by a lattice mismatch to GaAs;

the base layer at least comprises an InGaAs layer grown by pseudomorphic growth, and the emitter layer at least comprises an InGaP layer with a CuPt-type ordering, the InGaP layer has a first side close to the base layer and a second side opposite to the first side and away from the base layer, a degree of the CuPt-type ordering of the InGaP layer varies in a manner that the degree of the CuPt-type ordering of the InGaP layer at the first side is higher than the degree of the CuPt-type ordering of the InGaP layer at the second side.

13. The compound semiconductor heterojunction bipolar transistor according to claim 12, wherein when composition of the first InGaP layer is described as $In_iGa_{1-i}P$, an In content i is in a range of 0.48 to 0.5.

14. The compound semiconductor heterojunction bipolar transistor according to claim 12, wherein when composition of the InGaAs layer is described as $In_jGa_{1-j}As$, an average value of an In content j is in a range of 0.05 to 0.12.

15. The compound semiconductor heterojunction bipolar transistor according to claim 12, wherein the degree of the CuPt-type ordering of the InGaP layer increases gradually from the second side to the first side.

* * * * *